United States Patent
Khanam et al.

(10) Patent No.: US 12,439,764 B2
(45) Date of Patent: Oct. 7, 2025

(54) PHOTOVOLTAIC DEVICES AND METHODS

(71) Applicant: The Florida State University Research Foundation, Inc., Tallahassee, FL (US)

(72) Inventors: Jobeda Jamal Khanam, Tallahassee, FL (US); Simon Y. Foo, Tallahassee, FL (US)

(73) Assignee: The Florida State University Research Foundation, Inc., Tallahassee, FL (US)

( * ) Notice: Subject to any disclaimer, the term of this patent is extended or adjusted under 35 U.S.C. 154(b) by 0 days.

(21) Appl. No.: 18/343,356

(22) Filed: Jun. 28, 2023

(65) Prior Publication Data

US 2023/0343884 A1    Oct. 26, 2023

Related U.S. Application Data

(60) Division of application No. 18/059,803, filed on Nov. 29, 2022, now Pat. No. 12,009,443, which is a
(Continued)

(51) Int. Cl.
*H10K 30/57* (2023.01)
*H10F 71/00* (2025.01)
(Continued)

(52) U.S. Cl.
CPC ......... *H10K 30/57* (2023.02); *H10F 71/1375* (2025.01); *H10F 77/127* (2025.01); *H10F 77/1433* (2025.01); *H10F 77/211* (2025.01); *H10F 77/247* (2025.01); *H10F 77/251* (2025.01); *H10K 85/50* (2023.02); *H10F 77/143* (2025.01); *H10F 77/1437* (2025.01);
(Continued)

(58) Field of Classification Search
CPC ..... H01L 31/035218; H01L 31/022425; H01L 31/022475; H01L 31/022483; H01L 31/0324; H01L 31/188; H01L 31/035209; H01L 31/035227; H01L 31/035236; H10K 10/82; H10K 30/30; H10K 30/211; H10K 30/83; H10K 85/50; H10K 85/1135; H10K 71/15; H10K 30/57; Y02E 10/549

See application file for complete search history.

(56) References Cited

U.S. PATENT DOCUMENTS 3,483,038 A    12/1969   Hui et al.
2001/0035206 A1  11/2001   Inamasu et al.
(Continued)

OTHER PUBLICATIONS

Yannan Zhang "Realizing solution-processed monolithic PbS QDs/perovskite tandem solar cells with high UV stability" J. Mater. Chem. A, 2018, 6, 24693 (Year: 2018).*
(Continued)

*Primary Examiner* — Michael Y Sun
(74) *Attorney, Agent, or Firm* — Eversheds Sutherland (US) LLP

(57) ABSTRACT

Photovoltaic devices, and methods of fabricating photovoltaic devices. The photovoltaic devices may include a first electrode, at least one quantum dot layer, at least one semiconductor layer, and a second electrode. The first electrode may include a layer including Cr and one or more silver contacts.

17 Claims, 16 Drawing Sheets

Related U.S. Application Data continuation of application No. 16/659,626, filed on Oct. 22, 2019, now Pat. No. 11,522,094.

(60) Provisional application No. 62/749,783, filed on Oct. 24, 2018.

(51) Int. Cl.
*H10F 77/12* (2025.01)
*H10F 77/14* (2025.01)
*H10F 77/20* (2025.01)
*H10K 85/50* (2023.01)
*H10K 10/82* (2023.01)
*H10K 30/20* (2023.01)
*H10K 30/30* (2023.01)
*H10K 30/50* (2023.01)

(52) U.S. Cl.
CPC ............ *H10F 77/146* (2025.01); *H10K 10/82* (2023.02); *H10K 30/211* (2023.02); *H10K 30/30* (2023.02); *H10K 30/50* (2023.02)

(56) References Cited

U.S. PATENT DOCUMENTS

| | | |
|---|---|---|
| 2009/0305452 A1 | 12/2009 | Sargent et al. |
| 2010/0313945 A1 | 12/2010 | Le et al. |
| 2014/0193301 A1 | 7/2014 | Xiong et al. |
| 2017/0179391 A1* | 6/2017 | Venkataraman ....... H10K 30/35 |
| 2018/0175314 A1* | 6/2018 | Kippelen ............... H10K 85/10 |

OTHER PUBLICATIONS

Arfa Karani "Perovskite/Colloidal Quantum Dot Tandem Solar Cells: Theoretical Modeling and Monolithic Structure" ACS Energy Lett. 2018, 3, 869-874 (Year: 2018).*

Ryan W. Crisp "Tandem Solar Cells from Solution-Processed CdTe and PbS Quantum Dots Using a ZnTe—ZnO Tunnel Junction" Nano Lett. 2017, 17, 1020-1027 (Year: 2017).*

Po-Nan Yeh "Large active area inverted tandem polymer solar cell with high performance via alcohol treatment on the surface of bottom active layer P3HT:ICBA" Solar EnergyMaterials &SolarCells128(2014)240-247 (Year: 2014).*

Wang, K. et al. Inverted Organic Photovoltaic Cells, Chem. Soc. Rev. 2016, 45, 2937-2975.

Ren, Z. et al. Bilayer PbS Quantum Dots for High-Performance Photodetectors. Adv. Mater. 2017, 29, 1702055.

Wang, R.L. et al. Highly efficient inverted structural quantum dot solar cells, Adv. Mater. 2018, 30, 1704882.

Ganesan, A.A. et al. Quantum Dot Solar Cells: Small Beginnings Have Large Impacts, Appl. Sci. 2018, 8, 1867.

Bi, Y. et al. Infrared Solution-Processed Quantum Dot Solar Cells Reaching External Quantum Efficiency of 80% at 1.35 µm and Jsc in Excess of 34 mA cm-2, Adv. Mater. 2018, 30, 1704928.

Kim, B.-S. et al. Inorganic-ligand exchanging time effect in PbS quantum dot solar cell, Appl. Phys. Lett. 2016, 109, 063901.

Tang, J. et al. Colloidal-quantum-dot photovoltaics using atomic-ligand passivation, Nat. Mater. 2011, 10, 765.

Balazs, D.M.; et al. Counterion-Mediated Ligand Exchange for PbS Colloidal Quantum Dot Superlattices, ACS Nano 2015, 9, 11951-11959.

Szendrei, K. et al. PbS nanocrystal solar cells with high efficiency and fill factor. Appl. Phys. Lett. 2010, 97, 203501.

Lan, X. et al. 10.6% Certified Colloidal Quantum Dot Solar Cells via Solvent Polarity-Engineered Halide Passivation, Nano Lett. 2016, 16, 4630-4634.

Chuang, C.-H.M. et al. Improved performance and stability in quantum dot solar cells through band alignment engineering, Nat. Mater. 2014, 13, 796.

Wu, R. et al. Solvent Engineering for High-Performance PbS Quantum Dots Solar Cells. Nanomaterials 2017, 7, 201.

Zhang, J. et al. Diffusion-Controlled Synthesis of PbS and PbSe Quantum Dots within Situ Halide Passivation for Quantum Dot Solar Cells, ACS Nano 2014, 8, 614-622.

Wang, H. et al. PbS-Quantum-Dot-Based Heterojunction Solar Cells Utilizing ZnO Nanowires for High External Quantum Efficiency in the Near-Infrared Region, J. Phys. Chem. Lett. 2013, 4, 2455-2460.

Xu, W. et al. Efficient PbS QD solar cell with an inverted structure. Solar Energy Mater. Solar Cells 2017, 159, 503-509.

Brown, P.R. et al. Improved Current Extraction from ZnO/PbS Quantum Dot Heterojunction Photovoltaics Using a MoO3 Interfacial Layer, Nano Lett. 2011, 11, 2955-2961.

Kromhout, W. W. UCLA Engineers Create Tandem Polymer Solar Cells that set Record for Energy-Conversion, UCLA Samueli Newsroom, Feb. 12, 2012. <https://samueli.ucla.edu/ucla-engineers-create-tandem-polymer-solar-cells-that-set-record-for-energy-conversion/> (Accessed Jul. 2020).

Jin, Zhiwen et al., Detecting trap states in planar PbS colloidal quantum dot solar cells, Scientific Reports, vol. 6, Article No. 37106 (2016) (Year: 2016).

Gao, Wenhui et al., Towards understanding the initial performance improvement of PbS quantum dot solar cells upon short-term air exposure, RSC Adv., 2018, 8, 15149 (Year: 2018).

* cited by examiner

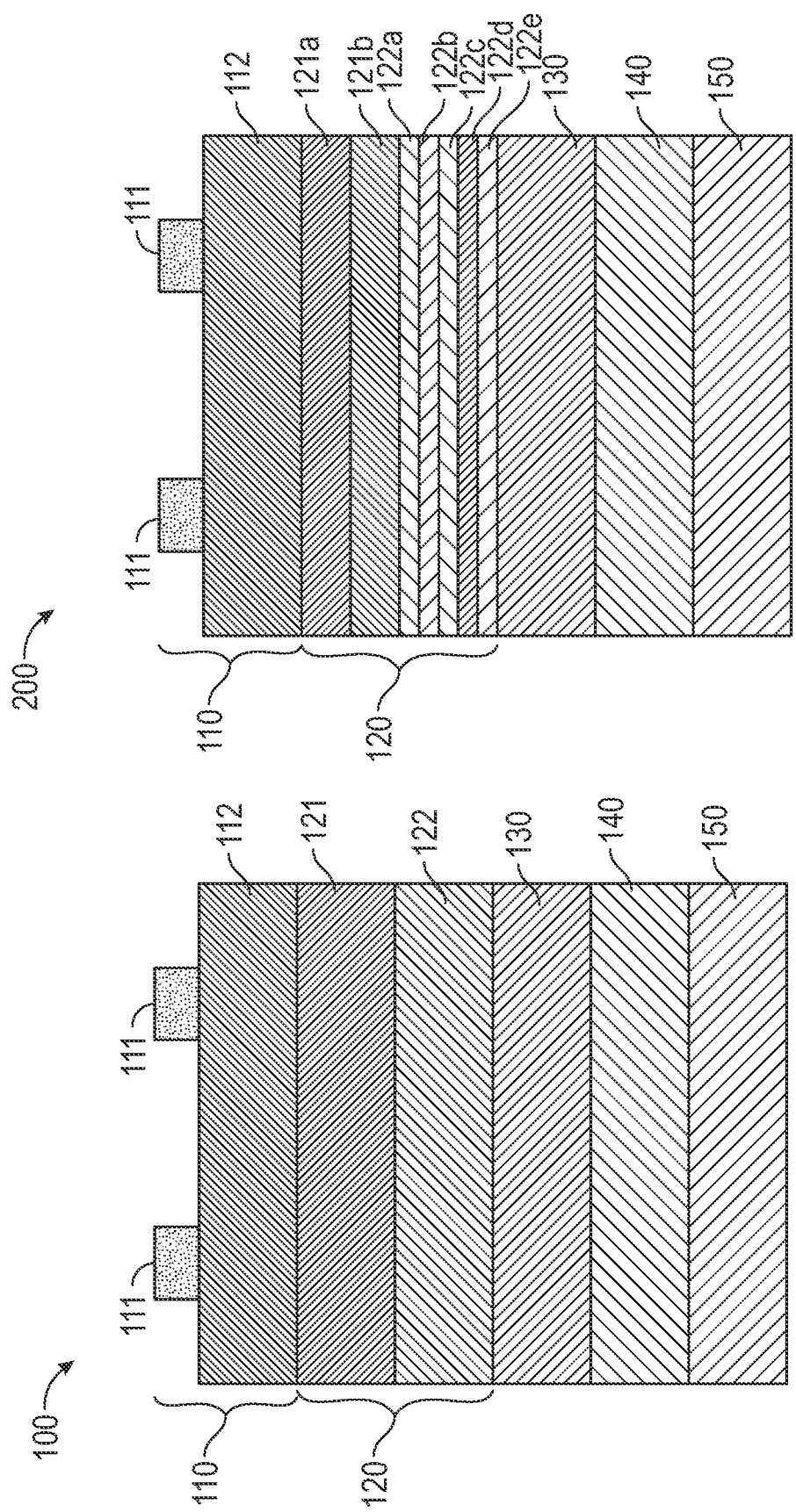

PHOTOVOLTAIC DEVICES AND METHODS

CROSS-REFERENCE TO RELATED APPLICATIONS

This application is a divisional of U.S. patent application Ser. No. 18/059,803, filed Nov. 29, 2022, which is a divisional of U.S. patent application Ser. No. 16/659,626, filed Oct. 22, 2019, now U.S. Pat. No. 11,522,094, which claims priority to U.S. Provisional Patent Application No. 62/749,783, filed Oct. 24, 2018. The content of these applications is incorporated by reference herein.

BACKGROUND

Polymer solar cells (PSCs) have attracted attention due to their ease of processing, low cost, flexibility, and/or lightweight nature compared to many traditional inorganic solar cells. However, the thicknesses of the materials used in polymer solar cells typically is limited due to their high absorption coefficient. For this reason and/or others, the efficiency of organic solar cells (OSCs) is still very low compared to the silicon solar cell.

There have been various methods implemented, such as annealing, device structure tuning, and active material modification, to improve the efficiency of PSCs. Among the various methods involving two or more organic junctions, PSCs with tandem structures have been attempted. Furthermore, photovoltaic devices that include a mixture of inorganic nanoparticles and conjugated polymers, which are referred to as hybrid solar cells, have the ability to absorb near-infrared light.

Adjusting the thicknesses of active layers in tandem photovoltaic cells is one way to alter their performance. The optimization of a tandem structure using trial and error experiments, however, is usually costly and/or ineffective. Simulation, therefore, may be a more effective tool to create improved tandem device structures. OSC devices generally include an organic layer arranged between two different metal electrodes. A bulk heterojunction (BHJ) organic solar cell typically includes three components: an active layer, a band alignment layer, and electrodes. The active layer typically is a homogeneous mixture of donor and acceptor materials. The donor materials are generally conjugated polymers, whereas the acceptor materials are typically fullerene derivatives. The power conversion efficiency of a promising structure (i.e., a P3HT:PCBM bulk heterojunction solar cell) has been reported to be 5% (Wang, K.; Liu, C.; Meng, T.; Yi, C.; Gong, X. Inverted Organic Photovoltaic Cells, *Chem. Soc. Rev.* 2016, 45, 2937-2975). It has been demonstrated that hybrid solar cell can absorb light having a wavelength up to 800 nm. Another study has showed that a one-junction polymer solar cell with a P3HT:PCBM active layer can cover the 800 nm light spectrum with 2.9% efficiency. Yet another study has showed that a one-junction polymer solar cell having a MEHPPV:PCBM active layer can cover the 800 nm light wavelength, and only produces a current density of 6.82 mA/cm$^2$. In most, if not all, reports to date, the simulation and optimization for these devices were conducted for one-junction PSC cells.

There remains a need for improved methods for simulating and/or optimizing devices, such as photovoltaic cells.

The semiconductor quantum dots (QDs) of groups IV and VI include the compounds PbSe and PbS. These semiconductors are commonly known to act as photo-absorbers in at least the near-infrared and visible regions of the light spectrum. PbS QDs have achieved recognition for the generation of multiple excitons, huge bandgap tunability, and/or relatively easy solution methods.

Colloidal QDs (CQDs) are generally inorganic semiconductor materials with organic molecules on their surface. By using a surface treatment, these materials may perform in a manner that is similar to either a positive (p-type) or negative (n-type) semiconductor. This feature may permit their usage in the architecture of optoelectronic organic, inorganic, and/or hybrid devices. PbS QD materials have been used and studied recently in applications in bilayer photodetectors (see, e.g., Ren, Z.; Sun, J.; Li, H.; Mao, P.; Wei, Y.; Zhong, X.; Hu, J.; Yang, S.; Wang, J. Bilayer PbS Quantum Dots for High-Performance Photodetectors. *Adv. Mater.* 2017, 29, 1702055), solar cells (see, e.g., Wang, R. L.; Wu, X.; Xu, K.; Zhou, W.; Shang, Y.; Tang, H.; Chen, H.; Ning, Z. Highly efficient inverted structural quantum dot solar cells, *Adv. Mater.* 2018, 30, 1704882; Ganesan, A. A.; Houtepen, A. J.; Crisp, R. W. Quantum Dot Solar Cells: Small Beginnings Have Large Impacts, *Appl. Sci.* 2018, 8, 1867; and Bi, Y.; Pradhan, S.; Gupta, S.; Akgul, M. Z.; Stavrinadis, A.; Konstantatos, G. Infrared Solution-Processed Quantum Dot Solar Cells Reaching External Quantum Efficiency of 80% at 1.35 µm and Jsc in Excess of 34 mA cm−2, *Adv. Mater.* 2018, 30, 1704928), cell imaging, and light-emitting diodes. The photovoltaic device architecture and the QD surface ligands may, in some instances, play a role in determining the optoelectronic properties of QD solar cells (see, e.g., Kim, B.-S.; Hong, J.; Hou, B.; Cho, Y.; Sohn, J. I.; Cha, S.; Kim, J. M. Inorganic-ligand exchanging time effect in PbS quantum dot solar cell, *Appl. Phys. Lett.* 2016, 109, 063901; Tang, J.; Kemp, K. W.; Hoogland, S.; Jeong, K. S.; Liu, H.; Levina, L.; Furukawa, M.; Wang, X.; Debnath, R.; Cha, D.; et al. Colloidal-quantum-dot photovoltaics using atomic-ligand passivation, *Nat. Mater.* 2011, 10, 765). CQD materials consist of individual QDs where the QDs remain side by side (see, e.g., Balazs, D. M.; Dirin, D. N.; Fang, H.-H.; Protesescu, L.; ten Brink, G. H.; Kooi, B. J.; Kovalenko, M. V.; Loi, M. A., Counterion-Mediated Ligand Exchange for PbS Colloidal Quantum Dot Superlattices, *ACS Nano* 2015, 9, 11951-11959; and Szendrei, K.; Gomulya, W.; Yarema, M.; Heiss, W.; Loi, M. A. PbS nanocrystal solar cells with high efficiency and fill factor. *Appl. Phys. Lett.* 2010, 97, 203501).

The surface morphology may, in some instances, play a role in achieving an efficient PbS QD solar cell, however, the surface-area-to-volume ratio becomes higher in QD materials, which can cause electronic traps, which, in turn, can increase the likelihood of charge recombination (see, e.g., Lan, X.; Voznyy, O.; Garcia de Arquer, F. P.; Liu, M.; Xu, J.; Proppe, A.; Walters, G.; Fan, F.; Tan, H.; Liu, M.; et al. 10.6% Certified Colloidal Quantum Dot Solar Cells via Solvent Polarity-Engineered Halide Passivation, *Nano Lett.* 2016, 16, 4630-4634).

To achieve continuous charge transfer and separation, the solar cell surface morphology may be considered. The film quality can depend on a number of factors, including, but not limited to, the quantum dot size, the concentration of QD material, the ligand exchanger and/or exchanging time, an annealing process, band alignment, solvent properties, or a combination thereof. The rate of evaporation, viscosity, and/or dispersibility may be properties of the solvent that may be adjusted in order to obtain pinhole-free and/or crack-free surfaces. Changing the ligand exchange time can also contribute to surface quality. Proper bandgap alignment of the device material can prevent charge recombination, thereby possibly reducing series resistance.

Extensive research on solar cells, including PbS QD solar cells, has been conducted, and most, if not all, of the research, has focused on solvent engineering and bandgap alignment (see, e.g., Chuang, C.-H. M.; Brown, P. R.; Bulovic', V.; Bawendi, M. G. Improved performance and stability in quantum dot solar cells through band alignment engineering, *Nat. Mater.* 2014, 13, 796; and Wu, R.; Yang, Y.; Li, M.; Qin, D.; Zhang, Y.; Hou, L. Solvent Engineering for High-Performance PbS Quantum Dots Solar Cells. *Nanomaterials* 2017, 7, 201). The research, however, has mainly avoided or failed to address a number of parameters, such as the photoactive layer thickness estimation, stability improvement, cost reduction, and/or the layer deposition process. In optoelectronic device fabrication, slot-die coating and screen printing has proven to be a product-compatible method for microfilm deposition. For thin-film (nano range) photovoltaic devices, however, these methods are not applicable. A blade coating deposition method is generally used for thin film deposition, but QD solutions, such as a PbS QD solution, may not be viscous enough to implement a blade coating process (see, e.g., Zhang, J.; Gao, J.; Miller, E. M.; Luther, J. M.; Beard, M. C. Diffusion-Controlled Synthesis of PbS and PbSe Quantum Dots within Situ Halide Passivation for Quantum Dot Solar Cells, *ACS Nano* 2014, 8, 614-622).

For this reason and others, there are a number of challenges regarding QD photovoltaic (PV) device fabrication, including PbS QD PV devices. These challenges include, but are not limited to, [1] the active layer thickness for fabricating the device, [2] the ability to use layer deposition methods other than spin coating, and/or [3] the high cost of most, if not all, QD solar cells, including PbS QD solar cells. Most, if not all, previous research suggests that PbS QDs at a high concentration (40 mg mL−1 to 100 mg mL−1) is required to fabricate a working device (see, e.g., Wang, H.; Kubo, T.; Nakazaki, J.; Kinoshita, T.; Segawa, H. PbS-Quantum-Dot-Based Heterojunction Solar Cells Utilizing ZnO Nanowires for High External Quantum Efficiency in the Near-Infrared Region, *J. Phys. Chem. Lett.* 2013, 4, 2455-2460, and Xu, W.; Tan, F.; Liu, Q.; Liu, X.; Jiang, Q.; Wei, L.; Zhang, W.; Wang, Z.; Qu, S.; Wang, Z. Efficient PbS QD solar cell with an inverted structure. *Solar Energy Mater. Solar Cells* 2017, 159, 503-509). Although previous studies have used highly concentrated PbS QDs (e.g., 30-50 mg/mL), only low fill factors were achieved (e.g., 40-50%) (see, e.g., Brown, P. R.; Lunt, R. R.; Zhao, N.; Osedach, T. P.; Wanger, D. D.; Chang, L.-Y.; Bawendi, M. G.; Bulovic', V. Improved Current Extraction from ZnO/PbS Quantum Dot Heterojunction Photovoltaics Using a MoO₃ Interfacial Layer, *Nano Lett.* 2011, 11, 2955-2961). The relatively high concentration of QDs can increase the cost of the devices significantly, especially when a spin coating process is used, because a relatively large amount of material is wasted during spin coating. Another disadvantage of current QD solar cells includes the use of only an Ag material as a back electrode. Such a back electrode does not provide device stability, because Ag may oxidize quickly to form an Ag₂O intermediate layer.

There remains a need for QD solar cells and methods of forming, optimizing, and/or simulating QD solar cells that address one or more of these disadvantages. For example, there remains a need for a low-cost, efficient, and/or more stable QD solar cell.

BRIEF SUMMARY

Provided herein are photovoltaic devices that address one or more of the foregoing needs, including photovoltaic devices that include PbS Qds and/or a Cr—Ag electrode, which can provide an electrode surface with air stability. The photovoltaic devices provided herein may be low-cost and/or stable. Methods of fabricating photovoltaic devices, including low-cost and/or stable photovoltaic devices, also are provided. The methods may include one of two types of deposition method. The methods provided herein may be performed at ambient temperature and/or pressure. The methods provided herein may reduce the costs of producing photovoltaic devices, at least in part, because the methods may deposit liquids that include a relatively low concentration of QDs. The methods also may produce photovoltaic devices having one or more layers that are uniform, crack-free, and/or pinhole-free.

In one aspect, photovoltaic devices are provided. In some embodiments, the photovoltaic devices include a first electrode that includes (i) a layer including Cr, and (ii) at least one contact that (a) includes Ag, and (b) is arranged on the layer including Cr; an active layer having a thickness of at least 350 nm, wherein the active layer includes (i) at least one first quantum dot layer including PbS quantum dots treated with 1,2-ethanedithiol, wherein the layer including Cr is arranged between the at least one contact and the at least one first quantum dot layer, and (ii) at least one second quantum dot layer including PbS quantum dots treated with tetrabutylammonium iodide; at least one semiconductor layer, wherein the at least one second quantum dot layer is arranged between the at least one first quantum dot layer and the at least one semiconductor layer; and a second electrode, wherein the at least one semiconductor layer is arranged between the at least one second quantum dot layer and the second electrode.

In some embodiments, the photovoltaic devices include a first electrode, a first layer stack, a second layer stack, wherein the first layer stack is arranged between the first electrode and the second layer stack, a second electrode, wherein the second layer stack is arranged between the first layer stack and the second electrode, optionally a third layer stack arranged between the second layer stack and the second electrode, and optionally a fourth layer stack arranged between the third layer stack and the second electrode. The first, second, third, and fourth layer stack may include a first, second, third, and fourth hole transporting layer, respectively, a first, second, third, and fourth active layer, respectively, and a first, second, third, and fourth electron transporting layer, respectively. The first, second, third, and fourth active layers may include one or more active materials. The one or more active materials may be independently selected from the group consisting of poly(3-hexylthiophene-2,5-diyl) (P3HT), indene-C₆₀ bisadduct (ICBA), poly([2,6'-4,8-di(5-ethylhexylthienyl)benzo[1,2-b;3,3-b]dithiophene]{3-fluoro-2[(2-ethylhexyl)carbonyl]thieno[3,4-b]thiophenediyl}) (PTB7-Th), [6,6]-phenyl-C71-butyric acid methyl ester (PCMB), poly[2,7-(5,5-bis-(3,7-dimethyloctyl)-5H-dithieno[3,2-b:2',3'-d]pyran)-alt-4,7-(5,6-dirluoro-2,1,3-benzothia diazole) (PDTP-DFBT), poly[[2,5-bis(2-hexyldecyl-2,3,5,6-tetrahydro-3,6-dioxopyrrolo[3,4-c]pyrrole-1,4-diyl]-alt-[3',3"-dimethyl-2,2':5',2"-terthiphene]-5,5"-diyl] (PMDPP3T), poly[2,1,3-benzothiadiazole-4,7-diyl[4,4-bis(2-ethylhexyl)-4H-silolo[3,2-b:4,5-b']dithiophene-2,6-diyl]] (Si-PCPDTBT), methylammonium lead iodide (MaPbI₃), and lead (II) sulfide (PbS).

In another aspect, methods of fabricating photovoltaic devices are provided. In some embodiments, the methods include performing one or more optical simulations to select (i) a thickness of at least one of the first active layer, the second active layer, the third active layer, and the fourth active layer, and/or (ii) the one or more active materials of at least one of the first active layer, the second active layer, the third active layer, and the fourth active layer.

In some embodiments, the methods include (i) providing a semiconductor layer arranged on a first electrode; (ii) disposing a first liquid and a first amount of PbS quantum dots on the semiconductor layer; (iii)(a) drying the first liquid or (b) spin coating the semiconductor layer to remove substantially all of the first liquid from the first amount of PbS quantum dots; (iv) disposing a first amount of tetrabutylammonium iodide on the first amount of PbS quantum dots; (v) contacting the tetrabutylammonium iodide with a rinsing liquid to remove at least a portion of the tetrabutylammonium iodide from the first amount of PbS quantum dots; (vi) optionally repeating steps (ii) to (v) one or more times; (vii) disposing a second liquid including a second amount of PbS quantum dots on the first amount of PbS quantum dots; (viii)(a) drying the second liquid or (b) spin coating the semiconductor layer to remove substantially all of the second liquid from the second amount of PbS quantum dots; (ix) disposing a first amount of 1,2-ethanedithiol on the second amount of PbS quantum dots; (x) contacting the 1,2-ethanedithiol with the rinsing liquid to remove at least a portion of the 1,2-ethanedithiol from the second amount of PbS quantum dots; (xi) optionally repeating steps (viii) to (x) one or more times; (xii) disposing a second electrode on the second amount of PbS quantum dots, wherein the disposing of the second electrode comprises (a) disposing a layer comprising Cr on the second amount of PbS quantum dots, and (b) disposing at least one contact comprising Ag on the layer comprising Cr.

In some embodiments, the methods of fabricating a photovoltaic device include using optical simulations to select the materials of construction and their thicknesses to build active layers of an organic polymer photovoltaic cell or a hybrid photovoltaic cell.

Additional aspects will be set forth in part in the description which follows, and in part will be obvious from the description, or may be learned by practice of the aspects described herein. The advantages described herein may be realized and attained by means of the elements and combinations particularly pointed out in the appended claims. It is to be understood that both the foregoing general description and the following detailed description are exemplary and explanatory only and are not restrictive.

BRIEF DESCRIPTION OF THE DRAWINGS

FIG. 1 depicts a schematic of a layer arrangement of an embodiment of a photovoltaic device.

FIG. 2 depicts a schematic of a layer arrangement of an embodiment of a photovoltaic device.

DETAILED DESCRIPTION

Figure 3:
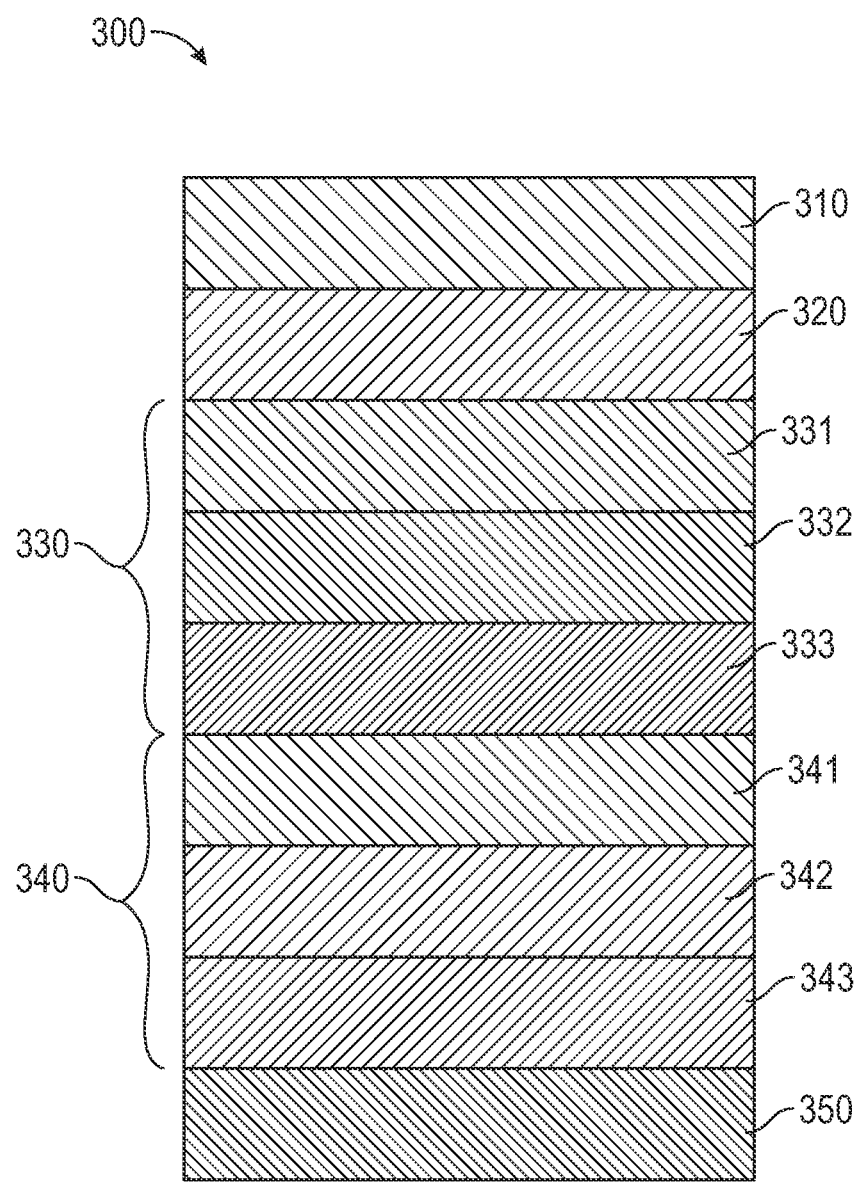
FIG. 3 depicts a schematic of a layer arrangement of an embodiment of a photovoltaic device.

Provided herein are photovoltaic devices, which may be referred to as solar cells.

In some embodiments, the photovoltaic devices include a first electrode that includes (i) a layer that includes Cr, and (ii) at least one contact that (a) includes Ag, and (b) is arranged on the layer including Cr; an active layer having a thickness of at least 350 nm, wherein the active layer includes (i) at least one first quantum dot layer including PbS quantum dots treated with 1,2-ethanedithiol, wherein the layer including Cr is arranged between the at least one contact and the at least one first quantum dot layer, and (ii) at least one second quantum dot layer including PbS quantum dots treated with tetrabutylammonium iodide; at least one semiconductor layer, wherein the at least one second quantum dot layer is arranged between the at least one first quantum dot layer and the at least one semiconductor layer; and a second electrode, wherein the at least one semiconductor layer is arranged between the at least one second quantum dot layer and the second electrode. In some embodiments, the active layer is in contact with (i) the layer including Cr, and (ii) the at least one semiconductor layer.

As used herein, the phrase "active layer" generally refers to a layer that is photovoltaic, or, in other words, capable of producing an electric current upon exposure to light, e.g., sunlight.

As used herein, the phrase "arranged between" does not connote that any two layers are necessarily in contact with each other; therefore, a layer that is "arranged between" two other layers may be in contact with (i) one of the other layers, (ii) both of the other layers, or (iii) neither of the other layers.

In some embodiments, the photovoltaic devices have a structure according to FIG. 1, which is a schematic of an embodiment of a layer arrangement. The device 100 of FIG. 1 includes a first electrode 110. The first electrode 110 includes a layer that includes chromium 112, and two contacts that include silver 111. The device 100 also includes an active layer 120 that includes at least one quantum dot layer 121 treated with a first liquid, and at least one quantum dot layer 122 treated with a second liquid. In some embodiments, the at least one quantum layer layers (121, 122) independently include quantum dot layers treated with 1,2-ethanedithiol, tetrabutylammonium iodide, or a combination thereof. The device 100 also includes a semiconductor layer 130, which may be a charge transporting layer, such as a hole transporting layer or electron transporting layer. The device 100 also includes a second electrode 140 that is arranged on substrate 150. The substrate 150 may be a transparent and/or flexible substrate. As used herein, the term "transparent" refers to materials having a total transmittance of at least 90%, or at least 95%, or at least 98%.

The photovoltaic devices generally may include any number of the first and second quantum dot layers. In some embodiments, the active layer includes 1 or 2 of the at least one first quantum dot layers. In some embodiments, the active layer includes 1 to 5 of the at least one second quantum dot layers. In some embodiments, the photovoltaic devices have a structure according to the schematic of FIG. 2. The device 200 of FIG. 2 includes a first electrode 110. The first electrode 110 includes a layer that includes chromium 112, and two contacts that includes silver 111. The device 200 also includes an active layer 120 that includes two quantum dot layers (121a, 121b) treated with a first liquid, and five quantum dot layer (122a, 122b, 122c, 122d, 122e) treated with a second liquid. The device 200 also includes a semiconductor layer 130, which may be a charge transporting layer, such as a hole transporting layer or electron transporting layer. The device 200 also includes a second electrode 140 that is arranged on substrate 150. The substrate 150 may be a transparent and/or flexible substrate.

The active layer of the photovoltaic device generally may have any thickness. The thickness of the active layer may be determined by the methods described in the Examples. In some embodiments, the active layer of the photovoltaic devices has a thickness of about 300 nm to about 1,500 nm, about 350 nm to about 1,500 nm, about 380 nm to about 1,500 nm, about 380 nm to about 1,000 nm, about 380 nm to about 750 nm, about 380 nm to about 500 nm, or about 380 nm to about 400 nm.

The layer including Cr that may be included in the first electrode of the photovoltaic devices generally may have any thickness. In some embodiments, the layer including Cr has a thickness of about 2 nm to about 10 nm, about 2 nm to about 8 nm, about 3 nm to about 7 nm, or about 5 nm.

In some embodiments, the photovoltaic devices have a fill factor of about 20% to about 60%, about 30% to about 50%, or about 40% to about 50%. The fill factor may be determined by the methods described in the Examples (see, e.g., Eq. 5).

The at least one semiconductor layer of the photovoltaic devices may include a charge transporting layer, a charge blocking layer, or a combination thereof. In some embodiments, the at least one semiconductor layer is an electron transporting layer. In some embodiments, the at least one semiconductor layer comprises ZnO.

In some embodiments, the photovoltaic devices herein may include two or more layer stacks arranged between a first electrode and a second electrodes, wherein each of the two or more layer stacks include a hole transport layer, an electron transport layer, and an active layer arranged between the hole transport layer and electron transport layer.

In some embodiments, the photovoltaic devices include a first electrode; a first layer stack; a second layer stack, wherein the first layer stack is arranged between the first electrode and the second layer stack; a second electrode, wherein the second layer stack is arranged between the first layer stack and the second electrode; optionally a third layer stack arranged between the second layer stack and the second electrode; and optionally a fourth layer stack arranged between the third layer stack and the second electrode; wherein the first layer stack comprises a first hole transporting layer, a first active layer, and a first electron transporting layer, wherein the first active layer is arranged between the first hole transporting layer and the first electron transporting layer; wherein the second layer stack comprises a second hole transporting layer, a second active layer, and a second electron transporting layer, wherein the second active layer is arranged between the second hole transporting layer and the second electron transporting layer; wherein the third layer stack, when present, comprises a third hole transporting layer, a third active layer, and a third electron transporting layer, wherein the third active layer is arranged between the third hole transporting layer and the third electron transporting layer; and wherein the fourth layer stack, when present, comprises a fourth hole transporting layer, a fourth active layer, and a fourth electron transporting layer, wherein the fourth active layer is arranged between the fourth hole transporting layer and the fourth electron transporting layer.

Figure 12:
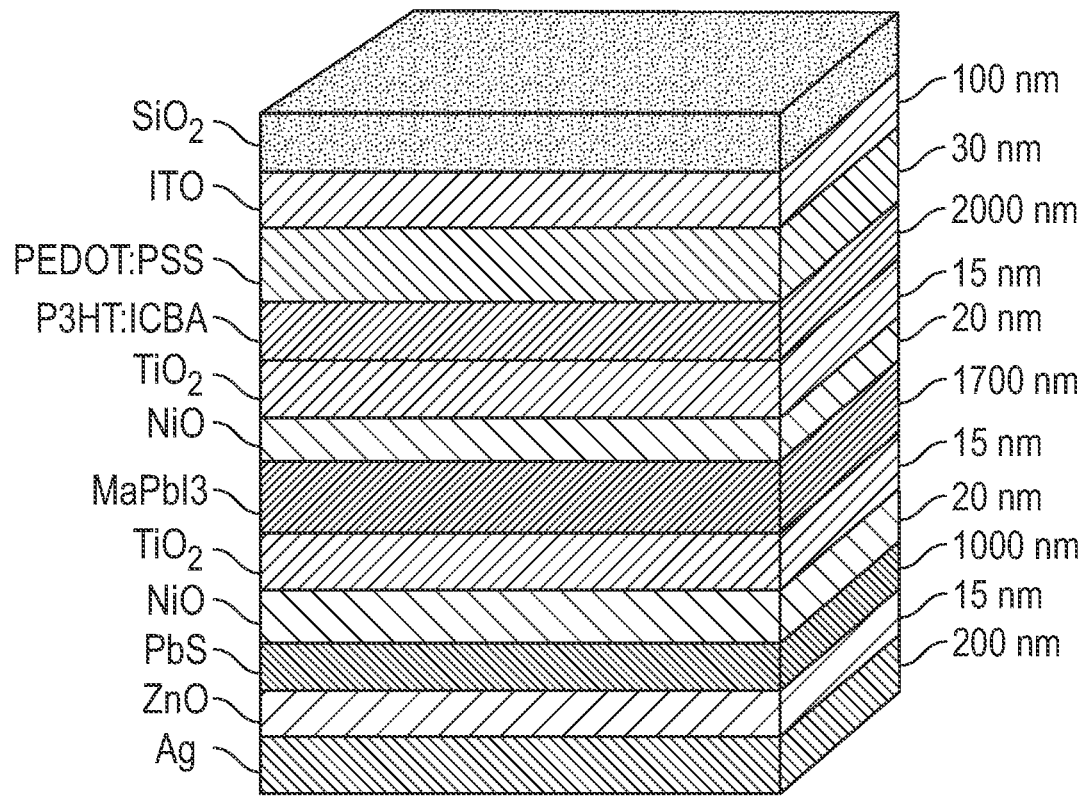
FIG. 12 is a schematic of a layer arrangement for an embodiment of a photovoltaic device.
Figure 13:
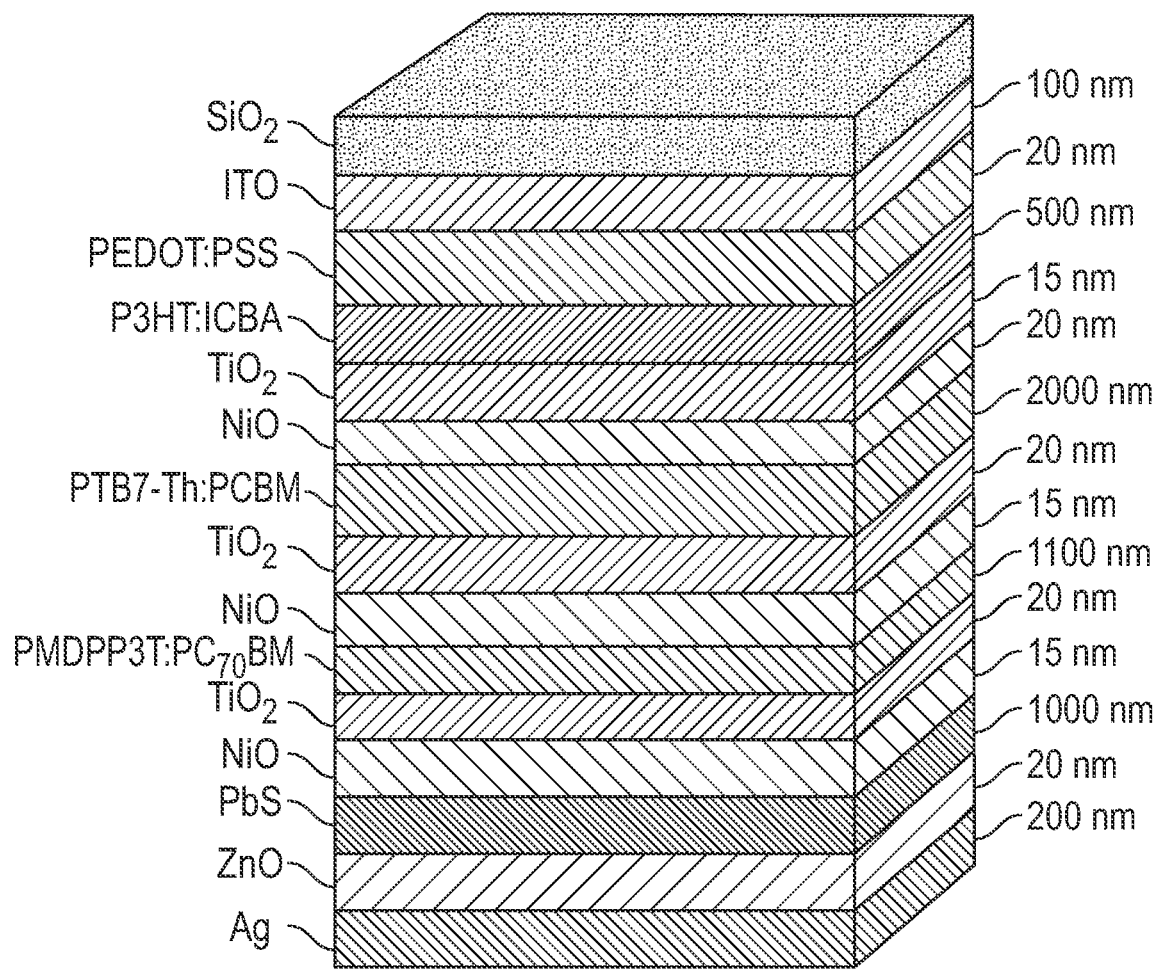
FIG. 13 is a schematic of a layer arrangement for an embodiment of a photovoltaic device.

In some embodiments, the photovoltaic devices have a structure according to the schematic of FIG. 3. The device 300 of FIG. 3 includes a substrate 310, a first electrode 320, a first layer stack 330, a second layer stack 340, and a second electrode 350. The first layer stack 330 includes a first hole transport layer 331, a first active layer 332, and a first electron transport layer 333. The second layer stack 340 includes a second hole transport layer 341, a second active layer 342, and a second electron transport layer 343. An embodiment of a photovoltaic device that includes three layer stacks is depicted at FIG. 12, and an embodiment of a photovoltaic device that includes four layer stacks is depicted at FIG. 13.

Figure 6:
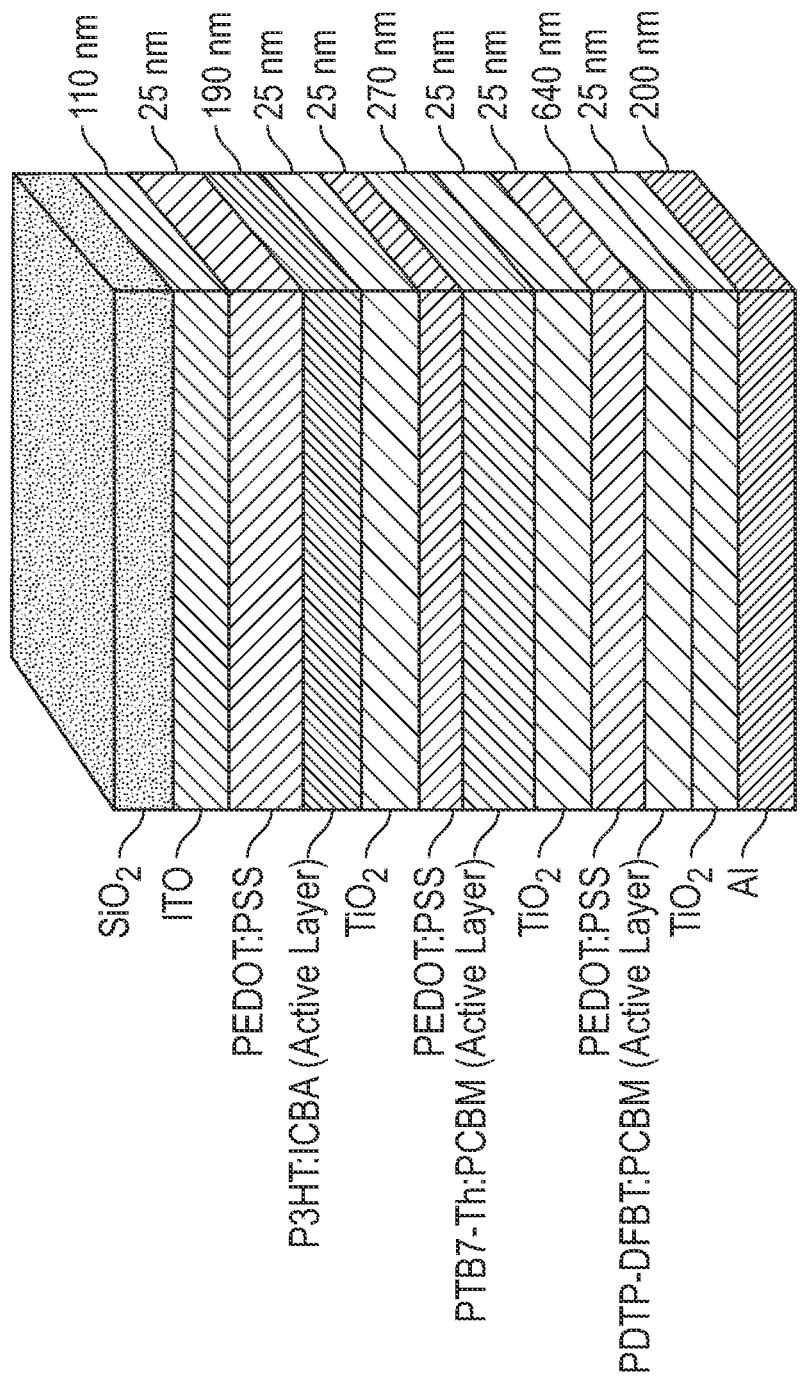
FIG. 6 is a schematic of a layer arrangement for an embodiment of a photovoltaic device.
Figure 7:
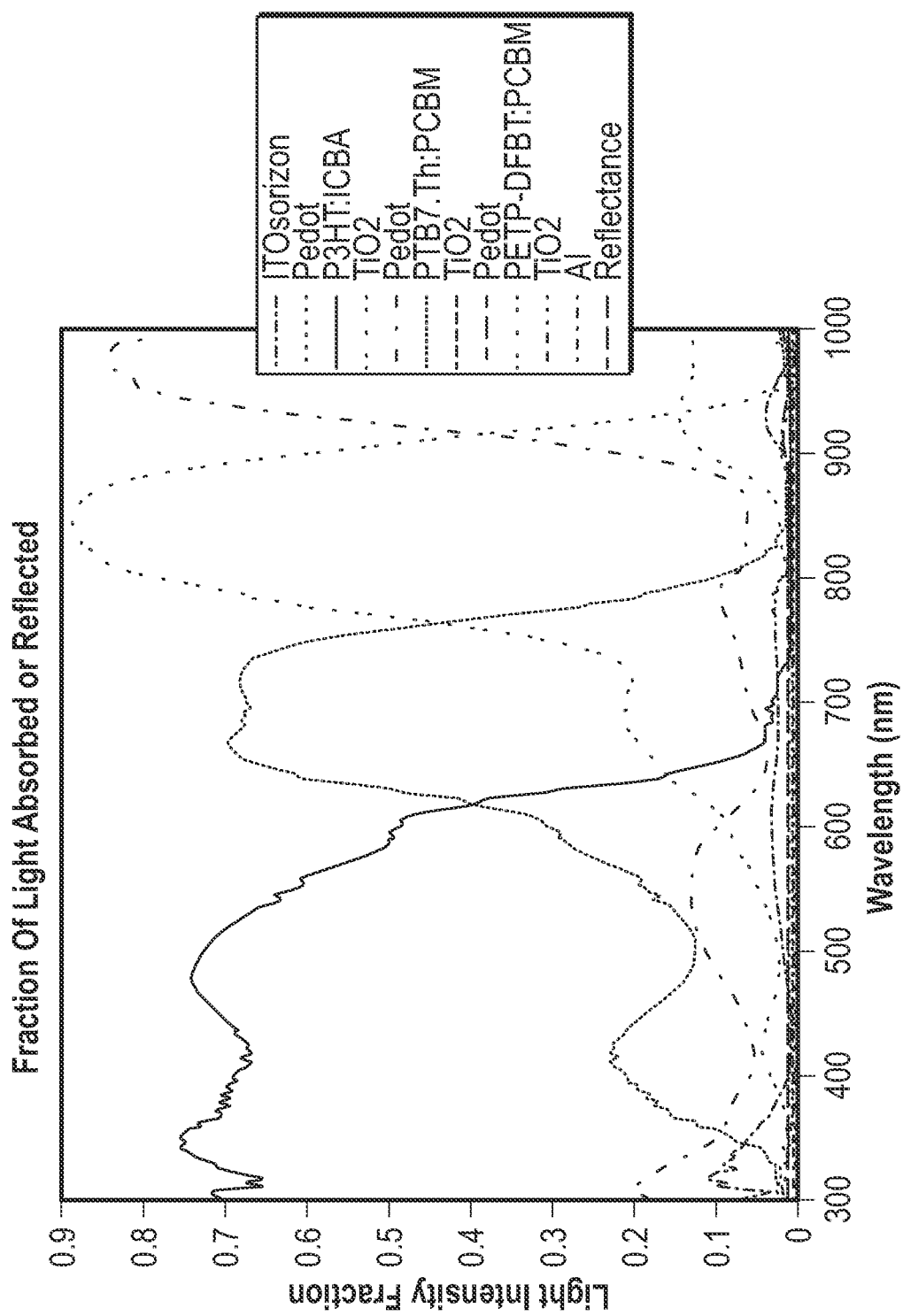
FIG. 7 depicts a plot of light intensity fraction versus wavelength for an embodiment of a photovoltaic device.
Figure 11:
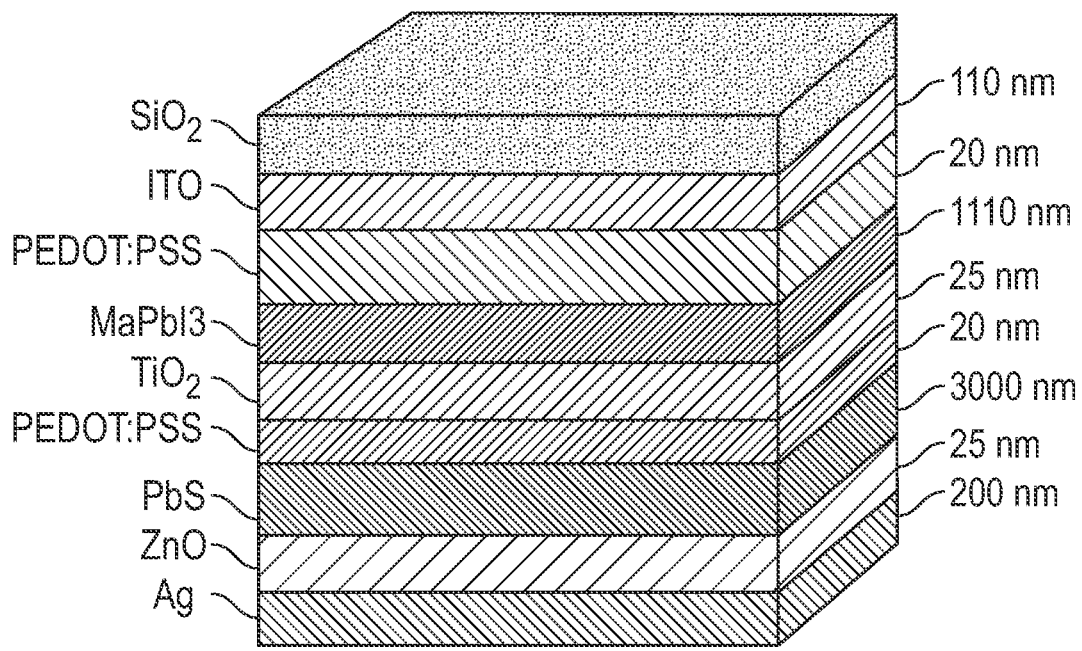
FIG. 11 is a schematic of a layer arrangement for an embodiment of a photovoltaic device.

Each of the first, second, third, and fourth layer stacks may be the same or different. When any two of the first, second, third, and fourth layer stacks are "different", then at least one of the layers of each layer stack is different. For example, as depicted at FIG. 6, a photovoltaic device may include three layer stacks, each including a different active layer, but identical hole and electron transporting layers. As a further example, as depicted at FIG. 11, the photovoltaic device may include two layer stacks, each have the same hole transporting layers, but different active layers and different electron transporting layers.

In some embodiments, the first active layer, the second active layer, the third active layer, and the fourth active layer include one or more active materials that are independently selected from the group consisting of poly(3-hexylthiophene-2,5-diyl) (P3HT), indene-$C_{60}$ bisadduct (ICBA), poly([2,6'-4,8-di(5-ethylhexylthienyl)benzo[1,2-b;3,3-b]dithiophene]{3-fluoro-2[(2-ethylhexyl)carbonyl]thieno[3,4-b]thiophenediyl}) (PTB7-Th), [6,6]-phenyl-C71-butyric acid methyl ester (PCMB), poly[2,7-(5,5-bis-(3,7-dimethyloctyl)-5H-dithieno[3,2-b:2',3'-d]pyran)-alt-4,7-(5,6-dirluoro-2,1,3-benzothia diazole) (PDTP-DFBT), poly[[2,5-bis(2-hexyldecyl-2,3,5,6-tetrahydro-3,6-dioxopyrrolo[3,4-c]pyrrole-1,4-diyl]-alt-[3',3"-dimethyl-2,2':5',2"-terthiphene]-5,5"-diyl] (PMDPP3T), poly[2,1,3-benzothiadiazole-4,7-diyl[4,4-bis(2-ethylhexyl)-4H-silolo[3,2-b:4,5-b']

dithiophene-2,6-diyl]] (Si-PCPDTBT), methylammonium lead iodide (MaPbI$_3$), and lead (II) sulfide (PbS).

Hole Transporting Layers

Generally, the hole transporting layers of the devices herein may include any known hole transporting material. In some embodiments, the hole transporting layers include at least one hole transporting material and at least one matrix material. The hole transporting material may include one or more of poly(3,4-ethylenedioxythiophene) polystyrene sulfonate (PEDOT:PSS), nickel oxide (NiO), or a combination thereof.

Electron Transporting Layers

Generally, the electron transporting layers of the devices herein may include any known electron transporting material. In some embodiments, the electron transporting layers include at least one electron transporting material and at least one matrix material.

In some embodiments, the electron transporting material includes a metal oxide. Non-limiting of metal oxides include SnO$_2$, TiO$_2$, ZnO, [6,6]-phenyl-C$_{61}$-butyric acid methyl ester (PCBM), or a combination thereof. The electron transporting material, in some embodiments, includes zinc oxide, titanium (IV) oxide, or a combination thereof.

Hole Transporting Materials

Generally, any known hole transporting material may be used in the hole transporting layers of the devices provided herein. In some embodiments, the hole transporting material is an inorganic hole transporting material, an organic hole transporting material, or a combination thereof. In some embodiments, the hole transporting material is a polymeric hole transporting material. In some embodiments, the hole transporting material is a small organic molecule hole transporting material.

In some embodiments, the hole transporting materials include N$^2$,N$^2$,N$^{2\prime}$,N$^{2\prime}$,N$^7$,N$^7$,N$^{7\prime}$,N$^{7\prime}$-octakis(4-methoxyphenyl)-9,9'-spirobi[9H-fluorene]-2,2',7,7'-tetramine (Spiro-OMeTAD), polytriarylamine (PTAA), fluorine-dithiophene (FDT), Cu-phthalocyanine (CuPc), copper (I) thiocyanate (CuSCN), poly 3-hexylthiophene (P3HT), poly(3,4-ethylenedioxythiophene) polystyrene sulfonate (PEDOT:PSS), poly[[(2,4-dimethylphenyl)imino]-1,4-phenylene(9,9-dioctyl-9H-fluorene-2,7-diyl)-1,4-phenylene] (PF8-TAA), poly(9,9-dioctylfluorene) (PFO), polyaniline (PANI), poly[N-9'-heptadecanyl-2,7-carbazole-alt-5,5-(4',7'-di-2-thienyl-2',1',3'-benzothiadiazole) (PCPDTBT), N-(6-amino-2,4-dioxo-1-propylpyrimidin-5-yl)-N-(2-methoxyethyl)-2-phenylbutanamide (PDPP3T), or a combination thereof.

Matrix Materials

Any matrix material in which a charge transporting material or other material may be dispersed can be used in the devices provided herein. In some embodiments, the matrix material is transparent, flexible, or a combination thereof.

In some embodiments, the matrix material includes polydimethylsiloxane (PDMS), poly(methyl methacrylate) (PMMA), polystyrene, polycarbonate, polyurethane (PU), polyvinylidene fluoride (PVDF), or a combination thereof.

Any amount of a charge transporting material or other material may be dispersed in a matrix material non-uniformly or substantially uniformly. In some embodiments, a weight ratio of a charge transporting material to matrix material is about 0.1:1 to about 1:0.1, about 0.3:1 to about 1:0.3, about 0.5:1 to about 1:0.5, about 0.8:1 to about 1:0.8, about 0.9:1 to about 1:0.9, or about 1:1.

Substrate

The substrates of the devices herein may include any material. In some embodiments, the substrate is transparent, flexible, or a combination thereof.

In some embodiments, the substrate includes a glass, such as SiO$_2$, or an organic material, such as polyethylene terephthalate (PET), polydimethylsiloxane (PDMS), hydroxypropylcellulose (HPC), or a combination thereof.

Electrodes

The electrodes of the devices herein may include any conductive material. In some embodiments, a first electrode and/or second electrode includes indium tin oxide (ITO), In$_2$O$_3$/Au/Ag, Au, Ag, Al carbon-based material, Cr, or a combination thereof. The carbon-based material may include carbon nanotubes, carbon nanofibers, or a combination thereof. In some embodiments, the carbon-based material includes a buckypaper.

Methods

Also provided herein are methods of fabricating a photovoltaic devices, including those described herein. In some embodiments, the methods include (i) providing a semiconductor layer arranged on a first electrode; (ii) disposing a first liquid and a first amount of PbS quantum dots on the semiconductor layer; (iii)(a) drying the first liquid or (b) spin coating the semiconductor layer to remove substantially all of the first liquid from the first amount of PbS quantum dots; (iv) disposing a first amount of tetrabutylammonium iodide on the first amount of PbS quantum dots; (v) contacting the tetrabutylammonium iodide with a first rinsing liquid to remove at least a portion of the tetrabutylammonium iodide from the first amount of PbS quantum dots; (vi) optionally repeating steps (ii) to (v) one or more times; (vii) disposing a second liquid and a second amount of PbS quantum dots on the first amount of PbS quantum dots; (viii)(a) drying the second liquid or (b) spin coating the semiconductor layer to remove substantially all of the second liquid from the second amount of PbS quantum dots; (ix) disposing a first amount of 1,2-ethanedithiol on the second amount of PbS quantum dots; (x) contacting the 1,2-ethanedithiol with a second rinsing liquid to remove at least a portion of the 1,2-ethanedithiol from the second amount of PbS quantum dots; (xi) optionally repeating steps (viii) to (x) one or more times; (xii) disposing a second electrode on the second amount of PbS quantum dots, wherein the disposing of the second electrode comprises (a) disposing a layer comprising Cr on the second amount of PbS quantum dots, and (b) disposing at least one contact comprising Ag on the layer comprising Cr.

Generally, steps (ii) to (v) may be performed any number of times. The number of times may be selected to fabricate a layer having one or more desired properties, such as thickness. In some embodiments, steps (ii) to (v) are repeated 0 to 4 times. In other words, steps (ii) to (v) may be performed one time, two times, three times, four times, or five times.

Generally, steps (viii) to (x) may be performed any number of times. The number of times may be selected to fabricate a layer having one or more desired properties, such as thickness. In some embodiments, steps (viii) to (x) are repeated once. In other words, steps (viii) to (x) are performed twice.

PbS quantum dots may be disposed in the first liquid and/or the second liquid prior to depositing the first liquid and/or the second liquid. The concentration of the PbS quantum dots in the first liquid and/or the second liquid may be the same or different, and may be selected from any concentration. The concentration of PbS quantum dots may be a relatively low concentration (less than or equal to 40 mg/mL) in the first liquid and/or the second liquid. In some embodiments, a concentration of the PbS quantum dots in the first liquid and/or the second liquid is about 5 mg/mL to about 25 mg/mL. In some embodiments, a concentration of the PbS quantum dots in the first liquid and/or the second liquid is about 5 mg/mL to about 15 mg/mL.

The disposing of the layer that includes Cr and the at least one contact that includes Ag may be achieved by any known technique. In some embodiments, the disposing of the layer including Cr and the at least one contact including Ag includes thermally evaporating Cr and Ag, respectively.

The first and/or second rinsing liquid may be any liquid that is capable of rinsing, i.e., removing, at least a portion of the 1,2-ethanedithiol or tetrabutylammonium iodide. In some embodiments, the first and/or second rinsing liquid includes acetonitrile. The first and second rinsing liquid may the same or different.

In some embodiments, the semiconductor layer includes zinc oxide, and the first electrode includes indium tin oxide.

The methods provided herein also include performing one or more optical simulations to select one or more features of a photovoltaic device. In some embodiments, the methods include performing one or more optical simulations to select (i) a thickness of at least one of the first active layer, the second active layer, the third active layer, and the fourth active layer, and/or (ii) the one or more active materials of at least one of the first active layer, the second active layer, the third active layer, and the fourth active layer.

All referenced publications are incorporated herein by reference in their entirety. Furthermore, where a definition or use of a term in a reference, which is incorporated by reference herein, is inconsistent or contrary to the definition of that term provided herein, the definition of that term provided herein applies and the definition of that term in the reference does not apply.

While certain aspects of conventional technologies have been discussed to facilitate disclosure of various embodiments, the Applicant in no way disclaim these technical aspects, and it is contemplated that the present disclosure may encompass one or more of the conventional technical aspects discussed herein.

The present disclosure may address one or more of the problems and deficiencies of known methods and processes. However, it is contemplated that various embodiments may prove useful in addressing other problems and deficiencies in a number of technical areas. Therefore, the present disclosure should not necessarily be construed as limited to addressing any of the particular problems or deficiencies discussed herein.

In this specification, where a document, act or item of knowledge is referred to or discussed, this reference or discussion is not an admission that the document, act or item of knowledge or any combination thereof was at the priority date, publicly available, known to the public, part of common general knowledge, or otherwise constitutes prior art under the applicable statutory provisions; or is known to be relevant to an attempt to solve any problem with which this specification is concerned.

In the descriptions provided herein, the terms "includes," "is," "containing," "having," and "comprises" are used in an open-ended fashion, and thus should be interpreted to mean "including, but not limited to." When, for example, methods or devices are claimed or described in terms of "comprising" various steps or components, the methods and devices can also "consist essentially of" or "consist of" the various steps or components, unless stated otherwise.

The terms "a," "an," and "the" are intended to include plural alternatives, e.g., at least one. For instance, the disclosure of "a first electrode," "an active layer", and the like, is meant to encompass one, or mixtures or combinations of more than one first electrode, active layer, and the like, unless otherwise specified.

Various numerical ranges may be disclosed herein. When Applicant discloses or claims a range of any type, Applicant's intent is to disclose or claim individually each possible number that such a range could reasonably encompass, including end points of the range as well as any sub-ranges and combinations of sub-ranges encompassed therein, unless otherwise specified. Moreover, all numerical end points of ranges disclosed herein are approximate. As a representative example, Applicant discloses, in some embodiments, a concentration of the PbS quantum dots in the first liquid and/or the second liquid is about 5 mg/mL to about 15 mg/mL. This range should be interpreted as encompassing a minimum concentration of about 5 mg/mL, a maximum concentration of about 15 mg/mL, and further encompasses "about" each of 6 mg/mL, 7 mg/mL, 8 mg/mL, 9 mg/mL, 10 mg/mL, 11 mg/mL, 12 mg/mL, 13 mg/mL, and 14 mg/mL, including any ranges and sub-ranges between any of these values.

As used herein, the term "about" means plus or minus 10% of the numerical value of the number with which it is being used.

EXAMPLES

The present invention is further illustrated by the following examples, which are not to be construed in any way as imposing limitations upon the scope thereof. On the contrary, it is to be clearly understood that resort may be had to various other aspects, embodiments, modifications, and equivalents thereof which, after reading the description herein, may suggest themselves to one of ordinary skill in the art without departing from the spirit of the present invention or the scope of the appended claims. Thus, other aspects of this invention will be apparent to those skilled in the art from consideration of the specification and practice of the invention disclosed herein.

Example 1—Modeling of Photovoltaic Devices

In this example, it was demonstrated that a multi-junction hybrid solar cell can absorb light beyond 2500 nm and cover the whole solar spectrum with 20% efficiency. A tandem polymer also was created with 12% efficiency. The device structures of this example were arranged in such a way that the high band gap material on the top of the devices and lower band gap materials on the bottom of the devices were able to absorb the near-infrared spectrum of light. The tandem solar cell voltage was increased likely due to the multiple junctions, and the current also increased likely due to the fact that it covered the near-infrared spectrum, thereby increasing efficiency.

Theoretical Considerations: The organic and inorganic materials used in the simulations of this example are depicted at the following table. To reduce charge recombination, two different materials called the electron transport layer (ETL) and hole transport layer (HTL) were used, which collected the electron and hole, respectively, after charge separation in the interface.

Organic and Inorganic Materials Used in the Simulation of this Example

| Symbol | Name; Description |
|---|---|
| $SiO_2$ | Silicon dioxide, glass |
| ITO | Indium tin oxide; electrode that collects hole/anode |
| PEDOT:PSS | Poly polystyrene sulfonate; HTL |
| P3HT | Poly(3-hexylthiophene-2,5-diyl), electron donor |
| ICBA | Indene-C60 bisadduct, electron acceptor |
| $TiO_2$ | Titanium (IV) oxide, ETL |
| PTB7-Th | Poly([2,6'-4,8-di(5-ethylhexylthienyl) benzo[1,2-b;3,3-b] dithiophene] [3-fluoro-2[(2-ethylhexy]) carbonyl] thieno(3,4-b] thiophenediyl]), electron donor |
| PCBM | [6,6]-phenyl-C71-butyric acid methyl ester, electron acceptor |
| PDTP-DFBT | Poly[2,7-(5,5-bis-(3,7-dimethyloctyl)-5H-dithieno[3,2-b:2',3'-d] pyran)-alt-4,7-(5,6-difluoro-2,1,3 benzothia diazole); electron donor |
| Al | Aluminum; electrode that collects electron/cathode |
| PMDPP3T | Poly[[2,5-bis(2-hexyldecyl-2,3,5,6-tetrahydro-3,6-dioxopyrrolo[3,4-c] pyrrole-1,4-diyl]-alt-[3',3"-dimethyl-2,2';5',2"-terthiophene]-5,5"-diyl]; electron donor |
| Si-PCPDTBT | Poly[2,1,3-benzothiadiazole-4,7-diyl[4,4-bis(2-ethylhexyl)-4H-silolo [3,2-b:4,5-b'] dithiophene-2,6-diyl]]; electron donor |
| $MaPbI_3$ | Methylammonium lead iodide; semiconducting organic-inorganic material |
| PbS | Lead (II) sulphide; semiconducting inorganic material |
| Zno | Zinc oxide; ETL |
| Ag | Silver; electrode that collects electron/cathode |
| NiO | Nickel (II) oxide; HTL |

Solar Cell Modeling: Optical transfer matrix theory describes the optical processes inside a thin film layer stack, which is used to evaluate the power conversion efficiency of multijunction photovoltaic. When light having the energy of a photon with angular frequency to strikes on an organic solar cell, local energy dissipation take place.

The local energy dissipated in the organic solar cell at the point z is given by:

$$Q(z) = \frac{1}{2}c\varepsilon_0\alpha n|E(z)|^2 \qquad Eq. 1$$

where, $\varepsilon_0$ is the permittivity of vacuum, n is the real index of refraction, $\alpha$ is the absorption coefficient, k is the extinction coefficient, c is the speed of light, $\lambda$ is the wavelength and E is the optical electric field at the point z.

$$\alpha = \frac{4\pi k}{\lambda}$$

G $(z,\lambda)$, the exciton generation rate as a function of depth and wavelength is given by:

$$G(z, \lambda) = \frac{Q(z, \lambda)}{\hbar\omega}$$

where h is the plank constant and $$\hbar = \frac{h}{2\pi}.$$

Finally, one obtains the exciton generation rate at a depth of z by summing G $(z, \lambda)$ over the visible spectrum:

$$G(z) = \sum_{\lambda=300}^{\lambda=2500} G(z, \lambda) \qquad Eq. 2$$

For active layer thickness=t, the current density (mA/cm$^2$) $J_{sc}$ under AM1.5 illumination assuming 100% internal quantum efficiency is given by:

$$J_{sc} = q \times \int_0^t G(z)dz \qquad Eq. 3$$

An equivalent bulk heterojunction solar cell circuit is described below. In this example, a serial resistance $R_s=0.01\Omega$ was considered, and related to contact and bulk semiconductor resistances and a shunt resistance of $R_{sh}=1000\Omega$.

The J-V characteristics were obtained from following equation:

$$J = J_{sc} - J_o\left(\exp\left(\frac{q(V+Is)}{KT}\right) - 1\right) - \frac{V + 1.R_s}{R_{sh}} \qquad Eq. 4$$

$$\text{Here } J_o = J_{sc}/\left(\exp\left(\frac{q.V_{oc}}{KT}\right) - 1\right)$$

$J_o$ is saturation current density (mA/cm$^2$) under reverse bias, $V_{oc}$: open circuit voltage, $J_{sc}$: short circuit current density, q: elementary charge, k: Boltzmann constant, T: temperature (K), V: output voltage.

Another parameter is the fill factor FF defined as:

$$FF = P_{max}/(V_{oc} \cdot J_{sc}) = (V_{max} \cdot J_{max})/(V_{oc} \cdot J_{sc}) \qquad Eq.5$$

A parameter regarding cell performances is the power conversion efficiency (PCE) $\eta$:

$$\eta = \frac{V_{max} \cdot J_{max}}{P_{in}} = FF\frac{V_{oc} \cdot J_{sc}}{P_{in}} \qquad Eq. 6$$

wherein $J_{max}$ and $V_{max}$ are the current density and voltage corresponding to the maximum power $P_{max}$ delivered by the solar cell. Pin is the incident photon flux (in mWcm$^{-2}$) corresponding to AM 1.5 (i.e. Pin is 100 mWcm$^{-2}$).

The organic absorber films can be regarded as a semiconductor like material, where the band gap corresponds to the difference between the LUMO (Lowest Unoccupied Molecular Orbital) and the HOMO (Highest Occupied Molecular Orbital). The Voc can be calculated by following equation:

$$V_{OC} = \left[\frac{HOMO(D) - LUMO(A)}{q}\right] - 0.3V \qquad \text{Eq. 7}$$

Here, HOMO (D) is highest molecular orbital of donor material and LUMO (A) is the lower molecular orbital of acceptor materials.

The blending of donor and acceptor material provided a bulk heterojunction active layer. The HOMO and LUMO levels of donors and acceptors used in this example are shown at the following table.

HOMO and LUMO level of donor and acceptor of materials

| MATERIAL | LUMO (eV) | HOMO (eV) |
|---|---|---|
| PTB7-Th(donor) | −3.61 | −5.25 |
| PCBM (acceptor) | −3.9 | −5.9 |
| PMDPP3T(donor) | −3.6 | −5.2 |
| P3HT (donor) | −3.1 | −5 |
| PCPDTBT (donor) | −3.55 | −5.3 |
| MAPbI$_3$ | −3.93 | −5.46 |
| ICBA (acceptor) | −3.74 | −5.6 |
| Si-PCPDTBT (donor) | −3.55 | −5.3 |
| PDTP-DFBT (donor) | −3.64 | −5.26 |

Results for Multi-Junction Polymer Solar Cells: Three types of multi-junction polymer solar cells were investigated. Based on different active layers, the cell was stacked. The J-V characteristics and variation of light intensity on the cell were analyzed. The power conversion efficiency was calculated from the J-V curve. These three types of multi-junction polymer solar cell were simulated.

Type 1: Multi-Junction Polymer Solar Cell. By using the high, medium, and low bandgap organic materials, the stack was arranged for solar cells. The number of active layers determined the number of junctions. For the first multi-junction polymer solar cell, three active layers were used, and hence it was called the three-junction polymer solar cell.

During the first step, the optical properties were determine for a cell whose dimensions were—Glass/ITO (110 nm)/PEDOT:PSS (25 nm)/P3HT:ICBA (190 nm)/TiO$_2$ (25 nm)/PEDOT:PSS (25 nm)/PTB7-Th:PCBM 270 nm)/TiO$_2$ (25 nm)/PEDOT:PSS (25 nm)/PDTP-DFBT:PCBM (640 nm)/TiO$_2$ (25 nm)/Al (200 nm). The thickness of the active layer affected the open circuit voltage (V$_{oc}$) as well as the short circuit current (J$_{sc}$) and thus the overall power conversion efficiency (PCE). To optimize various active layers, a general rule of thumb was used: decreasing the active layer thickness would increase the V$_{oc}$ due to shorter diffusion length, while increasing the thickness would increase the J$_{sc}$. Thus, the cell was optimized to obtain the maximum performance.

The active layer thickness was estimated by using the MATLAB™ code (Burkhard, G. F.; Hoke, E. T. Transfer Matrix Optical Modeling. McGehee Group (Stanford Univ). 2011)("Stanford model").

Figure 4:
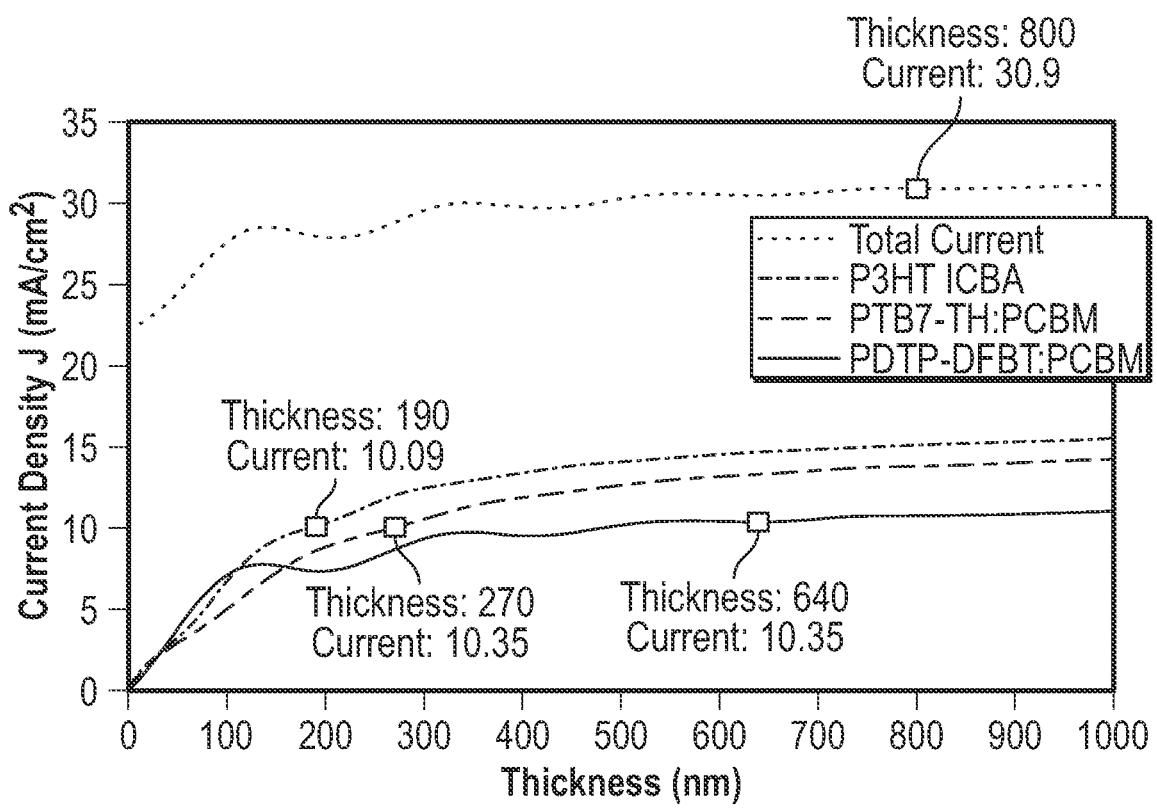
FIG. 4 depicts a plot of current density versus thickness for embodiments of type 1 multi-junction polymer solar cells.
Figure 5:
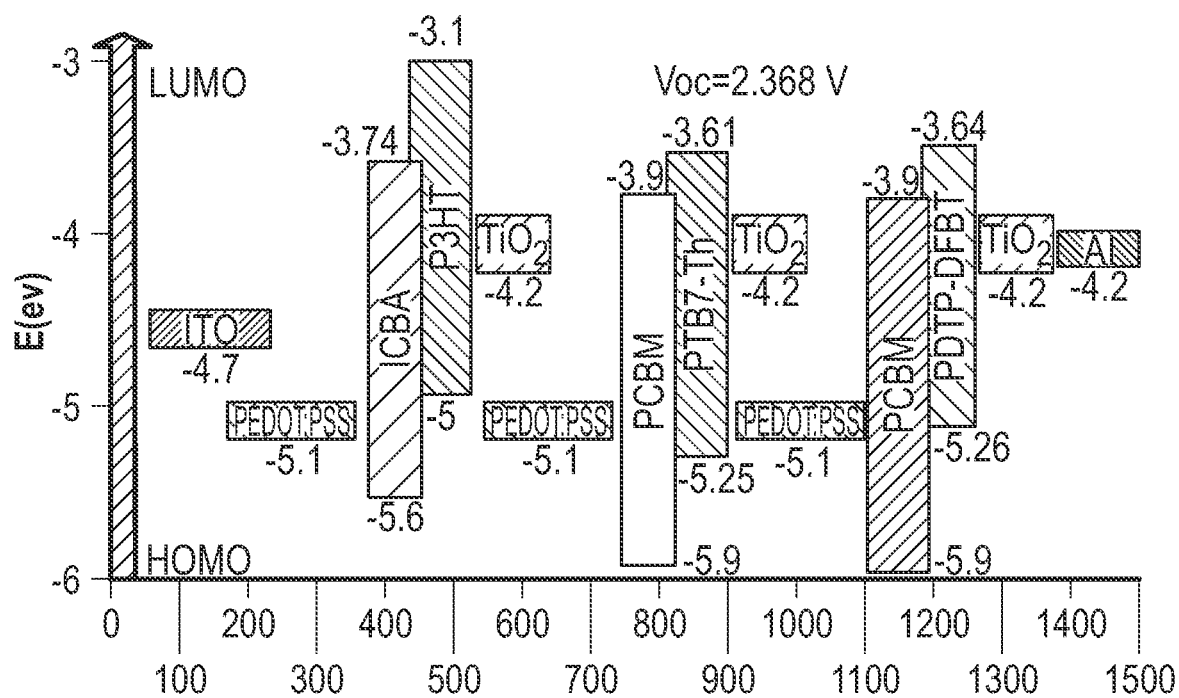
FIG. 5 is a HOMO and LUMO band diagram for an embodiment of a type 1 multi-junction polymer solar cell.

According to FIG. 4, the maximum total current that was possible from the type 1 solar cell was 30 mA/cm$^2$. As the three junctions were connected in series, each junction could provide 10 mA/cm$^2$ to obtain a maximum current of 30 mA/cm$^2$ from the cell. FIG. 4 demonstrates that if certain thicknesses were set (190 nm for P3HT:ICBA active layer, 270 nm for PTB7-Th:PCBM active layer and 640 nm for PDTP-DFBT:PCBM active layer), it was possible to obtain 10 mA/cm$^2$ for each junction. Using the MATLAB™ code, all the multi-junction polymer and hybrid cells optimized thicknesses were calculated. The HOMO and LUMO band diagram for the type 1 multi-junction PSC is depicted at FIG. 5. As showed by FIG. 5, with an active layer containing three different bandgaps, the open circuit voltage V$_{oc}$ was 2.368 V.

Figure 8:
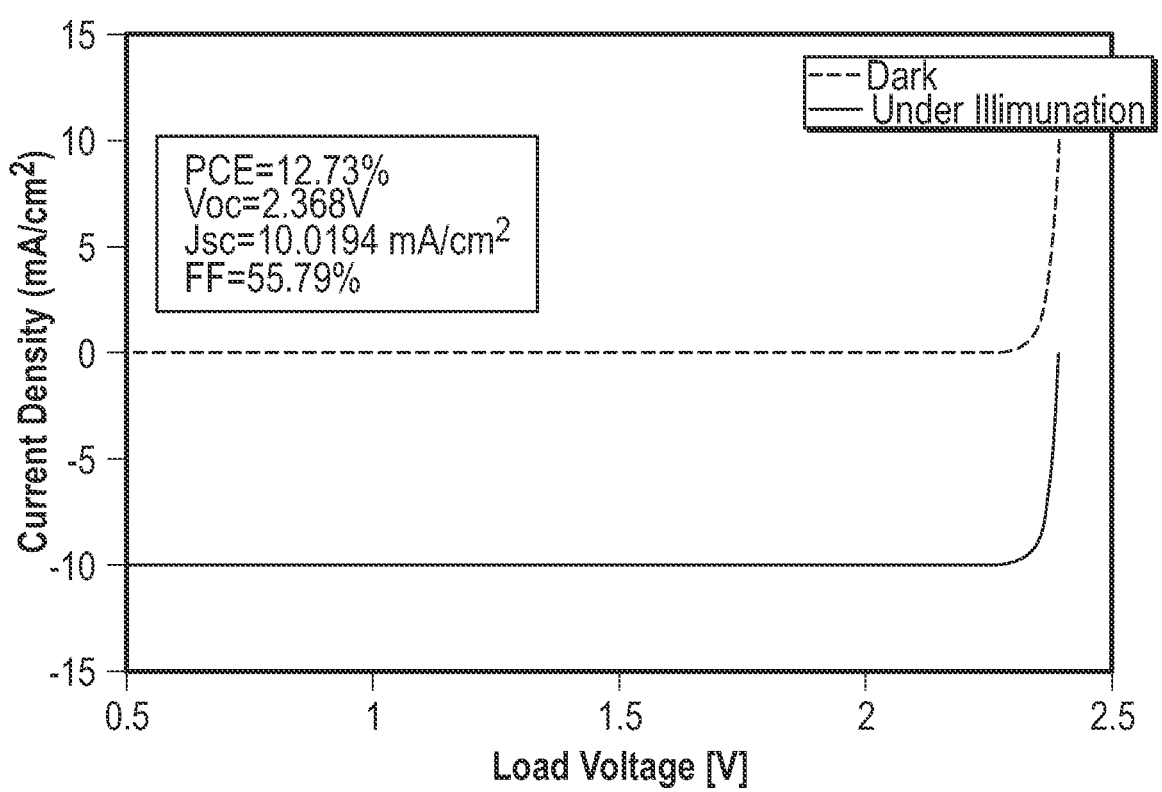
FIG. 8 depicts a plot of current density versus load voltage for an embodiment of a photovoltaic device.

A stack diagram for the three-junction OSC is depicted at FIG. 6, which includes three active layers of P3HT:ICBA (high bandgap), PTB7-Th:PCBM (medium bandgap) and PDTP-DFBT:PCBM (low bandgap) to cover the solar spectrum with wavelengths of 300-1000 nm, and the absorbed light intensity of this device was above 70%. From the simulation of this example, it was determined that J$_{sc}$ at each junction was 10.0194 mA/cm$^2$. The J-V characteristics are shown at FIG. 8. A PCE of 12.73% was achieved with this configuration.

Type 2: Multi-Junction Polymer Solar Cell. The optical properties of the second three-junction OSC were investigated. The dimensions of the cell are described as follows: Glass/ITO (110 nm)/PEDOT:PSS (25 nm)/P3HT:ICBA (235 nm)/TiO$_2$ (25 nm)/PEDOT:PSS (25 nm)/Si-PCPDTBT:PCBM (290 nm)/TiO$_2$ (25 nm)/PEDOT:PSS (25 nm)/PMDPP3T:PCBM (1000 nm)/TiO$_2$ (25 nm)/Al (200 nm). A HOMO and LUMO band diagram was produced, and it was determined that with an active layer of three different bandgaps, the open circuit voltage V$_{oc}$ was 2.07 V.

Figure 9:
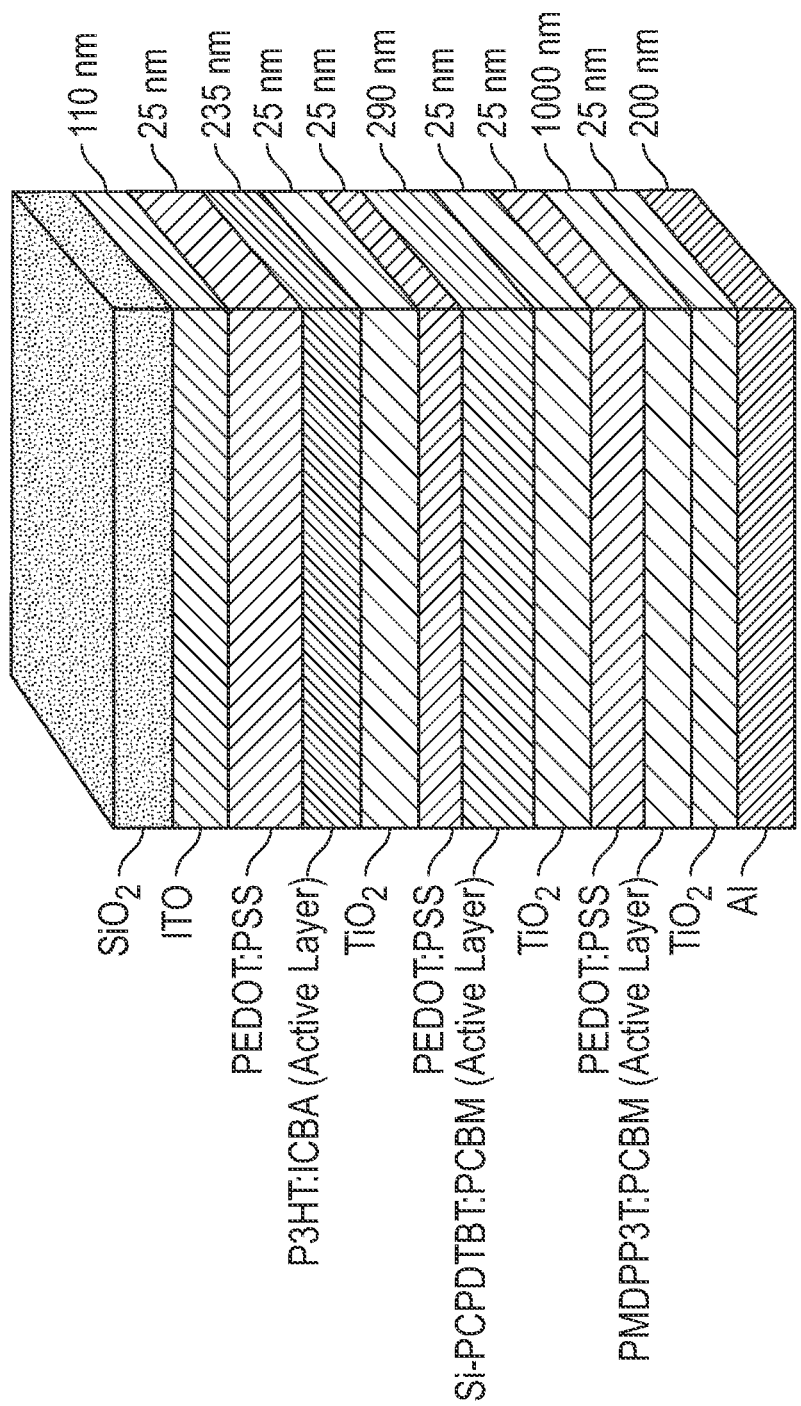
FIG. 9 is a schematic of a layer arrangement for an embodiment of a photovoltaic device.

The stack diagram for the three-junction OSC is depicted at FIG. 9. From a plot of light intensity fraction v. wavelength, it was noted that the three active layers of P3HT:ICBA, Si-PCPDTBT:PCBM and PMDPP3T:PCBM (low bandgap) covered the solar spectrum with wavelengths of 300-1000 nm and the light intensity was above 70%. J-V characteristics were also plotted. From the simulation, it was determined that J$_{sc}$ at each junction was 10.1962 mA/cm$^2$. A PCE of 10.03% was achieved with this configuration with an FF of 47.52%.

Type 3: Multi junction Polymer Solar Cell. The third three-junction OSC was investigated. The dimensions of the cell were Glass/ITO (110 nm)/PEDOT:PSS (25 nm)/P3HT:ICBA (200 nm)/TiO$_2$ (25 nm)/PEDOT:PSS (25 nm)/Si-PCPDTBT:PCBM (290 nm)/TiO$_2$ (25 nm)/PEDOT:PSS (25 nm)/PDTP-DFBT:PCBM (1000 nm)/TiO$_2$ (25 nm)/Al (200 nm). A HOMO and LUMO band diagram for the type 1 multi-junction PSC was produced. Based on the active layer of three different bandgaps, it was determined that the open circuit voltage Voc was 2.17 V.

Figure 10:
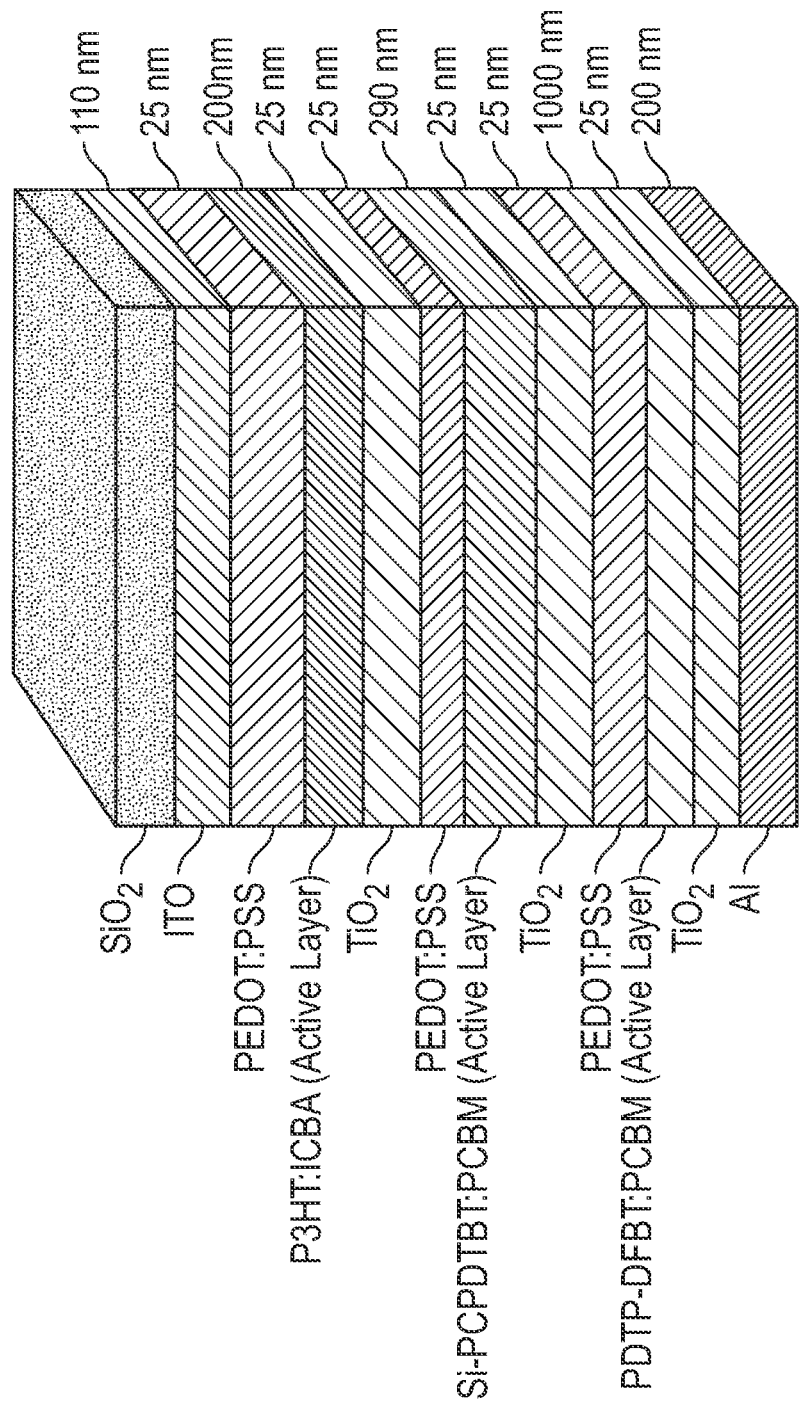
FIG. 10 is a schematic of a layer arrangement for an embodiment of a photovoltaic device.

The stack diagram for the three-junction OSC is shown at FIG. 10. From a plot of light intensity fraction v. wavelength, it was determined that the three active layers of P3HT:ICBA, Si-PCPDTBT:PCBM and PDTP-DFBT:PCBM covered the solar spectrum with a wavelength in the range of 300-1000 nm and the light intensity was above 80%. J-V characteristics were also plotted. From the simulation, it was determined that the J$_{sc}$ at each junction was 10.0130 mA/cm$^2$. A PCE of 10.90% was achieved using this configuration with a FF of 50.17%.

Results for Two-, Three-, and Four-Junction Hybrid Solar Cells. Two-, three- and four-junction hybrid solar cells were investigated. Based on different active layers, the cell was stacked. The J-V characteristics and variation of light intensity on the cell were analyzed. The power conversion efficiency was calculated from the J-V curve.

Two-Junction Hybrid Solar Cell: First, the two-junction hybrid solar cell (HSC) was simulated. The lead sulfide (PbS) was used as a low bandgap material to absorb light beyond the infrared spectrum. The active layer MaPbI$_3$ was organic and inorganic, while PbS in HSC is inorganic in nature. During the first step, the optical properties were determined for a cell whose dimensions were: Glass/ITO (100 nm)/PEDOT:PSS (20 nm)/P3HT:ICBA (300 nm)/TiO$_2$ (25 nm)/PEDOT:PSS (20 nm)/MaPbI$_3$ (1110 nm)/TiO$_2$ (25 nm)/PEDOT:PSS (20 nm)/PbS (3000 nm)/ZnO (25 nm)/Ag (200 nm). The stack diagram for the three-junction OSC is depicted at FIG. 11. A plot of light intensity fraction v. wavelength revealed that the two active layers of MaPbI$_3$ and rear PbS active layers covered the solar spectrum with wavelengths of 300 nm-2500 nm and the light intensity was above 80%. A plot of generation rate v. position in device revealed that only the active layers created excitons.

Three-Junction Hybrid Solar Cell: The second solar cell investigated was a three-junction HSC. The active layer of P3HT:ICBA was organic but MaPbI$_3$ was both inorganic and organic, and PbS was inorganic in nature. During the first step, the optical properties were determined of a cell whose dimensions were given by: Glass/ITO (100 nm)/PEDOT:PSS (30 nm)/P3HT:ICBA (2000 nm)/TiO$_2$ (15 nm)/NiO (20 nm)/MAPbI$_3$ (1700 nm)/TiO$_2$ (15 nm)/NiO (20 nm)/PbS (1000 nm)/ZnO (15 nm)/Ag (200 nm). The stack diagram for the three-junction OSC is depicted at FIG. 12. From a plot of light intensity fraction v. wavelength, it was determined that the three active layers of P3HT:ICBA, MaPbI$_3$ and rear PbS active layers covered the solar spectrum with wavelengths of 300 nm-2500 nm and the light intensity was above 80%. A plot of generation rate v. position in device revealed that the three active layers were producing excitons.

Four-Junction Hybrid Solar Cell: The third solar cell that was investigated was a four-junction HSC. During the first step, the optical properties were determined for a cell whose dimensions were as follows: Glass/ITO (100 nm)/PEDOT:PSS (20 nm)/P3HT:ICBA (500 nm)/TiO$_2$ (15 nm)/NiO (20 nm)/PTB7-Th:PCBM (2000 nm)/TiO$_2$ (20 nm)/NiO (15 nm)/PMDPP3T:PCBM (1100 nm)/TiO$_2$ (20 nm)/NiO (15 nm)/PbS (1000 nm)/ZnO (20 nm)/Ag (200 nm). The stack diagram for the three-junction OSC is depicted at FIG. 13. From a plot of light intensity fraction v. wavelength, it was determined that the three active layers of P3HT:ICBA, PTB7-Th:PCBM, PMDPP3T:PCBM and PbS covered the solar spectrum with wavelengths of 300 nm-2500 nm and the light intensity was above 80%. From a plot of generation rate v. position in device, it was observed that the four active layers are producing excitons.

Result analysis for three types of multi junction PSC and HSC: For the three types of multi-junction polymer solar cells, the efficiency v. fill factor were plotted. It was observed that the efficiency for all three types of PSCs were above 10%. However, the P3HT:ICBA, PTB7-Th:PCBM and PDTP-DFBT:PCBM three-junction PSC had a 12% efficiency. The J-V characteristics for two-, three- and four-junction hybrid solar cells also were plotted, and the plots indicated that two junctions produce a high J$_{sc}$ of 30 mA/cm$^2$ and four junctions produced a high V$_{oc}$ of 2.8 V. Another plot revealed that the power conversion efficiency was above 20% for the two-, three- and four-junction hybrid solar cells. It was observed that MAPbI$_3$ and PbS two-junction hybrid solar cell provided a 22% efficiency with a 55% fill factor.

As the fill factor was close to 50% for all cells, there was reasonable series resistance (Rs) and parallel resistance (Rsh) during the calculation of current density.

Theoretical settings were shown to improve the efficiency of the organic solar cells, which were determined by optical modeling using the transfer matrix. In multi-junction cells, the junctions were connected in series, hence each junction current was equal. By varying the active layer, the optimum current was found for each junction. The open circuit voltage was calculated by the HOMO and LUMO levels of the materials, which were used as active layers in OSCs and HSCs. The simulations were performed using the Stanford model. The performance of the devices varied with the active layer thickness. From the results of the simulations of this example, it was demonstrated that the multi-junction polymer solar cell and hybrid polymer solar cell could provide high efficiencies. The maximum PCE of 12.73% was achieved from the multi-junction polymer solar cell with the three active layers of P3HT:ICBA, Si-PCPDTBT:PCBM and PMDPP3T:PCBM. Lead sulfide (PbS) was shown to be the most promising low bandgap inorganic material, as it can absorb sunlight beyond the infrared spectrum. By using inorganic PbS and high band organic materials, a solar cell that absorbs sunlight beyond wavelengths of 2500 nm was devised (see Example 2). The two-, three- and four-junction hybrid solar cells provided a PCE above 20%. The two-junction hybrid solar cell provided a high current of 30 mA/cm$^2$ and the four-junction hybrid solar cell provided a high voltage of 2.8 V.

Example 2 Fabrication of PbS QD Photovoltaic Devices

Prior to the fabrication of the device, the MATLAB™ simulation of Example 1 was created and performed. The optimized thickness that would increase or maximum current density was estimated. Then, the device was fabricated, and the device was an inverted-structure ZnO/PbS QD device that aimed to attain the simulated optimized active layer (PbS QD) thickness. Several devices were fabricated and compared to analyze the performance of PbS QD solar cells using drop cast and spin coating methodologies. For cost optimization, 10 mg mL$^{-1}$ PbS QDs were used instead of highly concentrated PbS QDs. In an attempt to improve the air stability performance of the back electrode, a Cr—Ag electrode was used because it was believed that the Cr layer would provide stability and sticks to the surface of the cell. Thin layers of Cr (5-10 nm) did not usually modify the properties of the devices.

Materials: ITO (Indium Tin Oxide) coated glass substrates (110 nm, 8-12 Ω/sq), PbS core-type quantum dots, 1,2-ethanedithiol (EDT), tetrabutylammonium iodide (TBAI), and all liquids were obtained from Sigma-Aldrich (St. Louis, MO, USA), and were used without additional refinement or alteration. Cr (99.9%) and Ag (99.9%) pellets were obtained from Lesker (Jefferson Hills, PA, USA).

Figure 14A:
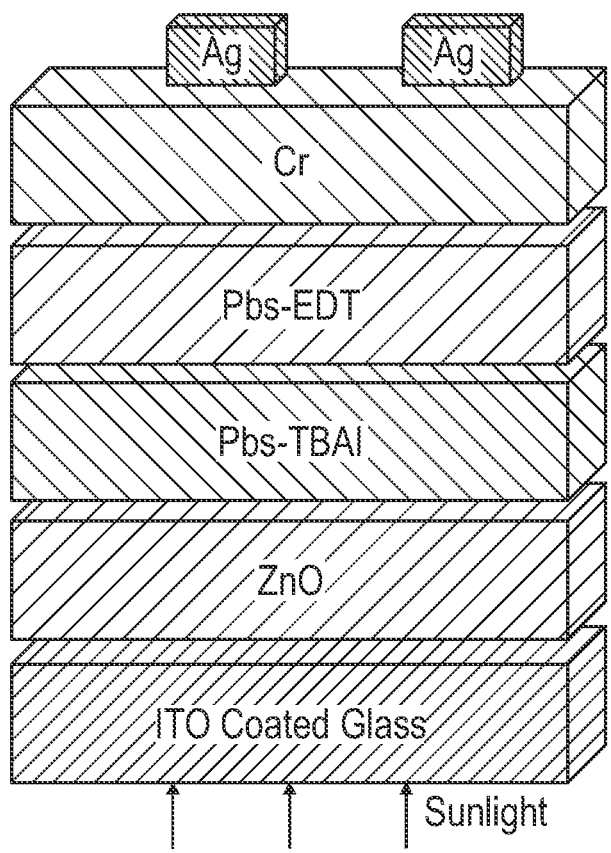
FIG. 14A depicts a schematic diagram of an embodiment of a device.
Figure 14B:
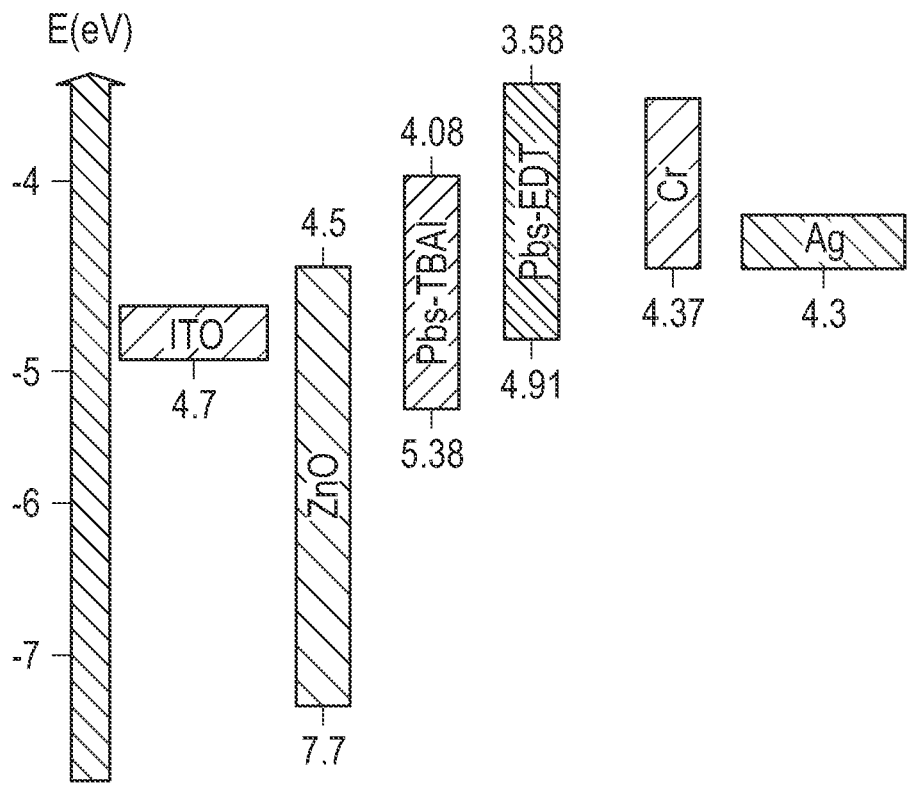
FIG. 14B depicts an energy level diagram of an embodiment of a PbS QD photovoltaic device.

Estimation of the PbS QD Layer Thickness: The structure of the PbS QD solar cells of this example was ITO/ZnO/PbS-TBAI/PbS-EDT/Cr/Ag. A schematic and band diagram for a device of this example is depicted at FIG. 14A and FIG. 14B, respectively.

Figure 15:
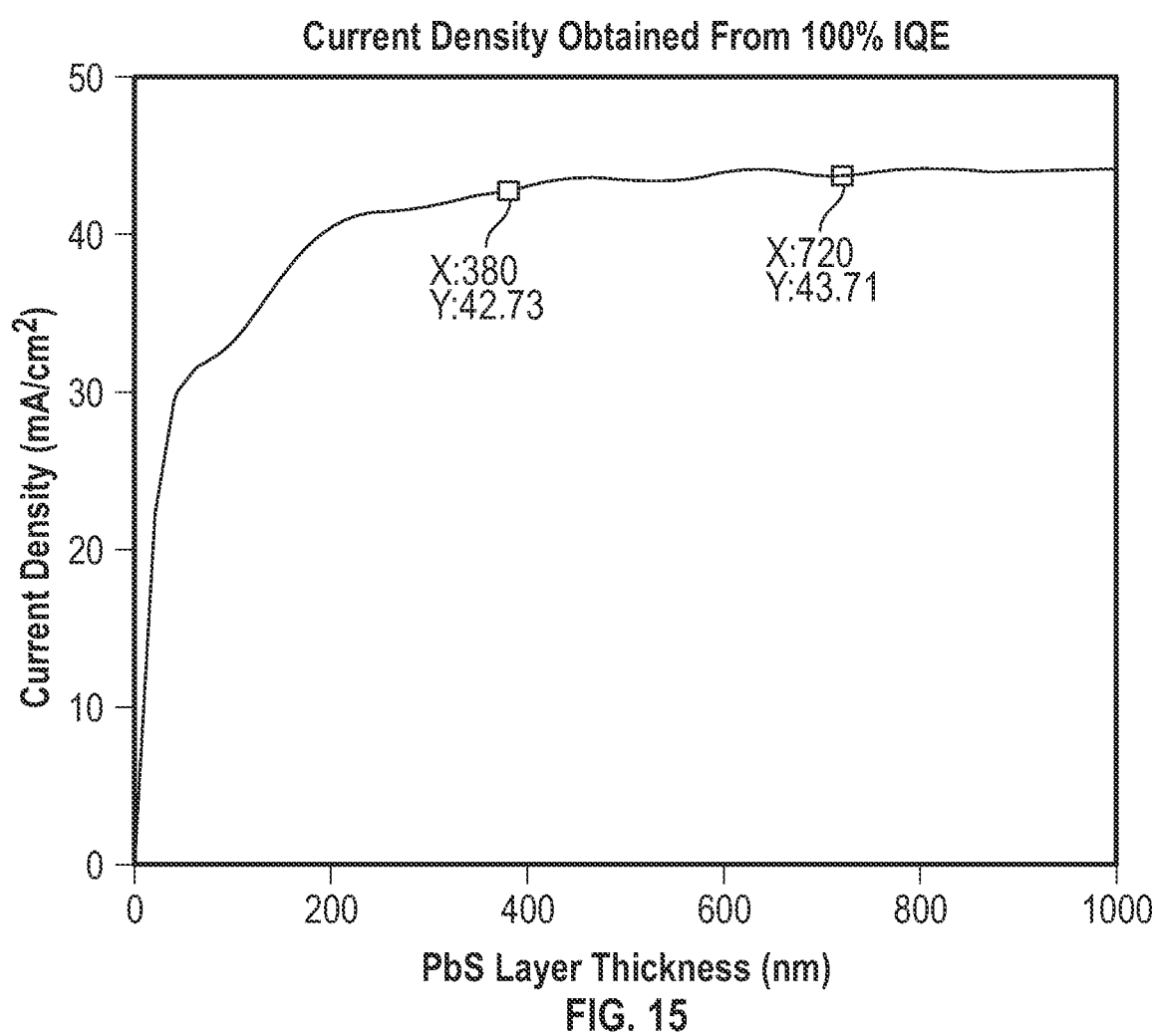
FIG. 15 depicts a plot of current density versus PbS layer thickness for an embodiment of a device.

The thickness of the PbS QD layer was estimated using the process reported by Khanam, J. J.; Foo, S. Y. Modeling of High-Efficjency Multi-Junction Polymer and Hybrid Solar Cells to Absorb Infrared Light, *Polymers* 2019, 11, 383. The MATLAB™ simulation processed the same device structure shown at FIG. 14A. By varying the thickness of the PbS, it was found, in this example, that a PbS thickness of 380 nm provided the maximum current density of 43 mA/cm$^2$ (FIG. 15). The current density was obtained from 100% Internal Quantum Efficiency (IQE).

Device Fabrication: On the ITO coated glass substrates, devices having the following structure were fabricated: (ITO/ZnO/PbS-TBAI/PbS-EDT/Cr/Ag). 1 M HCl was used in the etching process of the ITO coated glass in order to avoid, or at least limit, short circuiting. A detergent was first used to clean the substrate. Deionized water, isopropanol, and acetone were subsequently used to clean the substrate. The substrates were dried in a vacuum oven and subjected to an oxygen plasma treatment for about 5 minutes.

A ZnO nanoparticle solution was spin coated at 2000 rpm on the substrate for approximately 20 seconds to produce an 80 nm thick ZnO layer. The ITO/ZnO substrate was then heated for 20 minutes at 110° C.

For both spin coating and drop cast device fabrication, oleic-acid-coated PbS QDs with a concentration of 10 mg/mL in toluene solvent were used. For the ligand exchange process, 1,2-ethanedithiol (EDT) and tetrabutylammonium iodide (TBAI) were used. As organic and inorganic ligands, an EDT solution (0.04 vol % in acetonitrile (ACN)) and a TBAI solution (10 mg mL$^{-1}$ in methanol) were used, respectively. Due to ligand interchange, the device lost some surface layer volume. This generated cracks on the surface. To remove those cracks, ACN was used as a rinsing solvent. The spin coating and drop cast layer deposition methods were performed in open air and at ambient temperature.

Drop Cast Deposition Method for Device Fabrication: Active layers were deposited on the ITO/ZnO substrate using layer-by-layer (LbL) deposition of the drop cast method. Two-, three-, four-, five-, and six-layered devices were fabricated using the drop cast method to determine which layer number increased and/or maximized efficiency. For the PbS-TBAI photoactive layer deposition, about 30 μL of PbS QDs were dropped and allowed to dry completely on the ITO/ZnO substrate. Then, a TBAI solution was dropped onto the substrate and left for 40 seconds. The substrate was rinsed two times using ACN at 2000 rpm.

For the PbS-EDT photoactive layer deposition, about 30 μL of PbS QDs were dropped and allowed to dry completely on the ITO/ZnO substrate. After that, EDT solution was dropped onto the substrate and left for about 40 seconds. The same rinsing process as above was used.

Finally, the devices were heated at 110° C. for 5 minutes. The layered substrate was preserved in open air overnight. After that, for electrode evaporation, the substrate was moved to a nitrogen (N$_2$)-filled glove box. For thermal evaporation, the device was covered on the edges with Kapton tape and mounted on a sample holder with carbon tape. The chamber was pumped down to a 5×10$^{-7}$ torr base pressure before evaporation. Then, 5 nm Cr and 100 nm Ag were thermally evaporated at rates of 0.7 Å s$^{-1}$ and 1 Å s$^{-1}$, respectively, at reduced pressure (<10$^{-6}$ Torr). During thermal evaporation, a shadow mask was used. The photoactive area of the devices of this example was about 1 mm$^2$.

The Spin Coating Deposition Method for Device Fabrication: In the spin coating method, the photoactive layers were fabricated on the ITO/ZnO substrate by LBL deposition. A seven-layered device was fabricated with this method.

For the PbS-TBAI photoactive layers on the device, about 30 μL of PbS QDs were dropped onto the ITO/ZnO substrate for 90 seconds to adhere well to the glass. Then, the substrate was spin coated for 10 seconds at 2500 rpm. Then, a TBAI solution was dropped onto the substrate and left for about 40 seconds. The substrate was subsequently rinsed two times using ACN at 2000 rpm. For the PbS-EDT photoactive layer deposition, about 30 μL of PbS QDs was dropped and left for 90 seconds on the ITO/ZnO substrate. Then, the substrate was spin coated for 15 seconds at 2500 rpm. After that, an EDT solution was dropped onto the substrate and left for about 40 seconds. The same rinsing process as above was used. After deposition of two to three photoactive layers, the substrate was heated at 80° C. for 5 minutes. Then, the Cr—Ag electrode was deposited using thermal evaporation. The active device area was about 3 mm$^2$.

Device Characterization and Instrumentation: The current density-voltage (J-V) characteristics of the devices were measured to determine their efficiency. A KEITHLEY™ 2400 was used instrument at light intensity 100 mW/cm$^2$ to measure the J-V characteristics.

The surface structure and a cross-sectional view using a field emission scanning electron microscope (FESEM) were investigated. A UV-vis-NIR spectrophotometer (PerkinElmer Co., Waltham, MA, USA) was used to obtain the absorption spectra. The optical images were captured using an OLYMPUS' BX40 microscope with a 5× lens and a CCD camera (Teledyne Photometrics Co., Tucson, AZ, USA).

The surface film morphologies of both the drop cast and spin-coated PbS QDs were investigated using FESEM with different magnifications. For the drop cast deposition method, several cracks were observed on the film surface of the device. However, for the spin coating deposition method, the device surface was substantially crack free. In the spin-coated device, the film surface, although crack-free, was not uniform.

To assist with the achievement of a uniform surface, the devices were annealed after active layer deposition. Additionally or alternatively, the PbS QD materials were made more adhesive using a viscous solvent in order to improve the surface quality.

A cross-sectional view was collected to explore the devices and estimate the thicknesses of the layers. Large cracks and non-uniformity were observed in the cross-sectional view of a drop-cast device. In a spin-coated device, the film thickness was 802 nm, and the cross section was crack free.

Figure 16A:
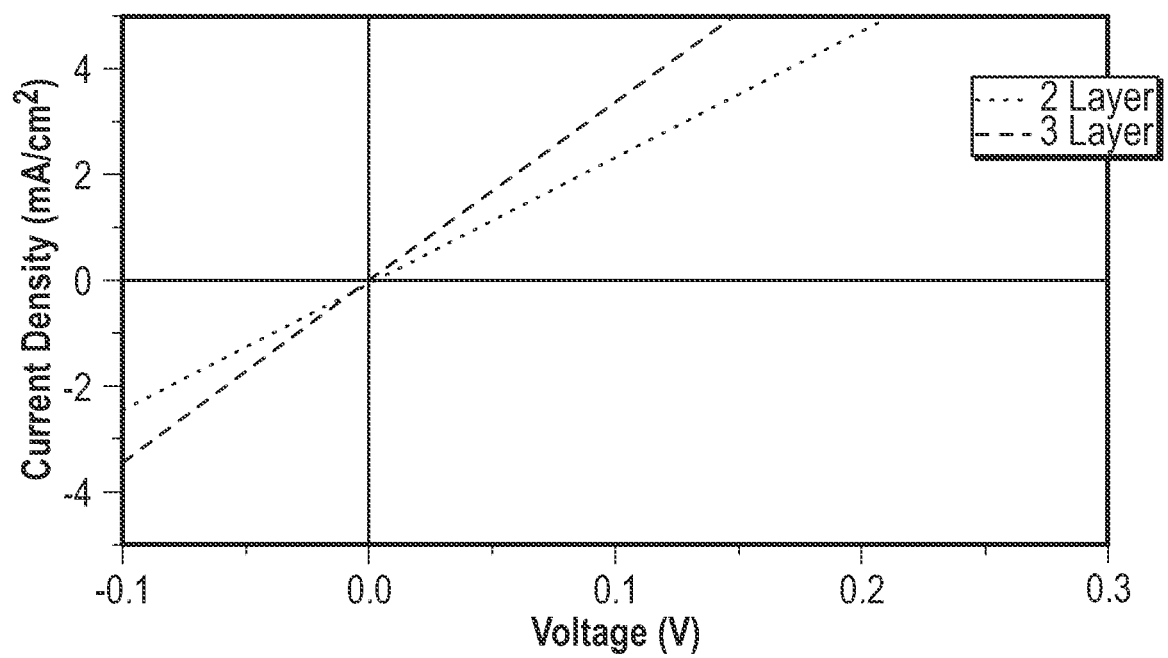
FIG. 16A depicts the J-V characteristics of embodiments of PbS QD solar cells with two or three photoactive layers prepared using a drop cast method.
Figure 16B:
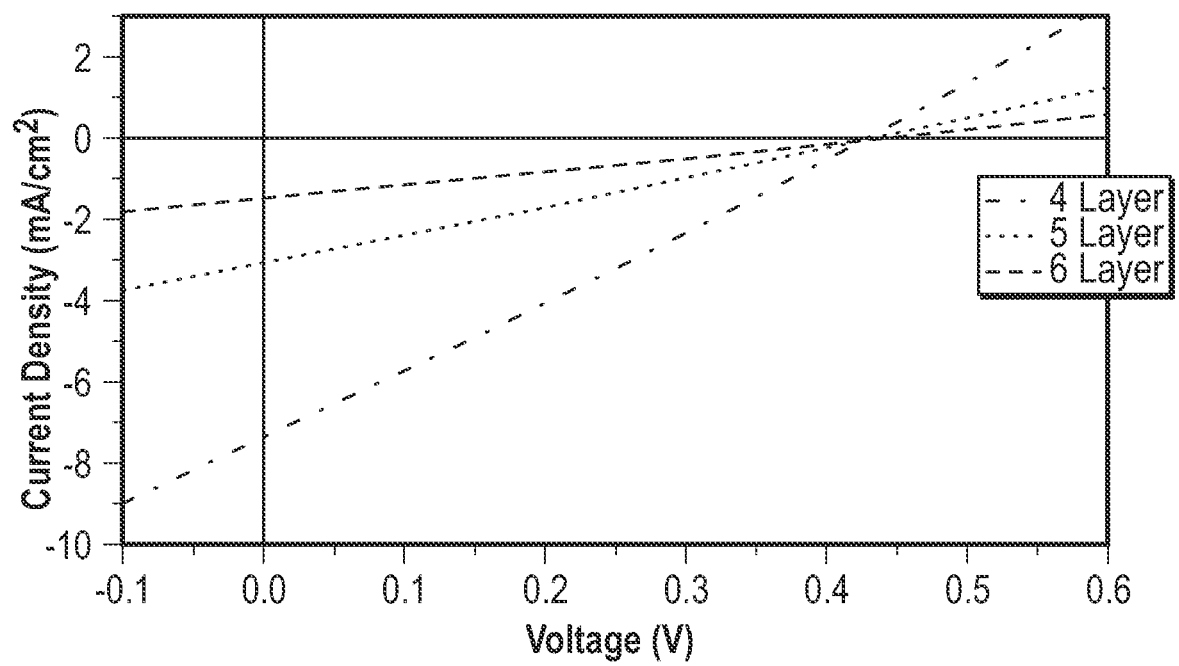
FIG. 16B depicts the J-V characteristics of embodiments of PbS QD solar cells with four, five, or six photoactive layers prepared using a drop cast method.

The J-V characteristics of the photovoltaic devices for different layers made using the drop cast method are depicted at FIG. 16A and FIG. 16B.

The following table indicates that the drop-cast devices consisting of two, three, four, five, and six layers of PbS showed power conversion efficiency (PCE) values of 0%, 0%, 1.5%, 0.55%, and 0.2%, respectively.

Device Parameters Obtained from Spin Coating and Drop Cast Methods.

| Deposition Process | Layer Deposition | Voc (V) | Jsc (mA/cm$^2$) | Fill Factor (FF) (%) | PCE (%) |
|---|---|---|---|---|---|
| Spin coating | 5 PbS-TBAI + 2 PbS-EDT (7 Layers) | 0.38 | 35 | 50 | 6.5 |
| Drop cast | 1 PbS-TBAI + 1 PbS-EDT (2 layers) | 0 | 0 | 0 | 0 |
| | 2 PbS-TBAI + 1 PbS-EDT (3 layers) | 0 | 0 | 0 | 0 |
| | 2 PbS-TBAI + 2 PbS-EDT (4 layers) | 0.4 | 7.5 | 50 | 1.5 |
| | 3 PbS-TBAI + 2 PbS-EDT (5 layers) | 0.4 | 3 | 46 | 0.55 |
| | 4 PbS-TBAI + 2 PbS-EDT (6 Layers) | 0.4 | 1 | 48 | 0.2 |

It was also observed that the open-circuit voltage ($V_{oc}$) was 0.4 V, but the current density ($J_{sc}$) varied in the drop-cast working devices (with four, five, and six layers). The four-layered PbS device showed a 1.5% PCE. The results showed that the drop cast method could provide a working device, but with very low efficiency.

Figure 17:
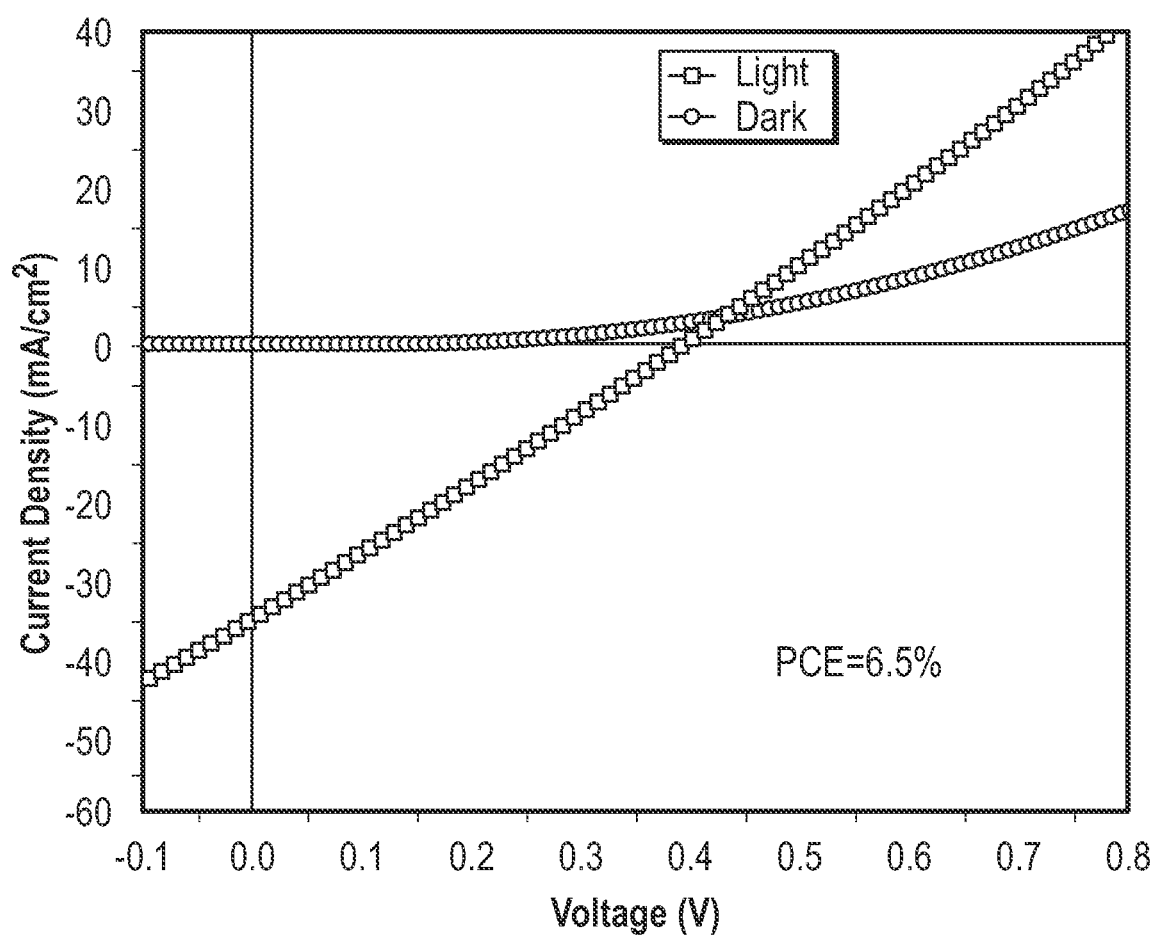
FIG. 17 depicts the J-V characteristics of an embodiment of a seven-layered device fabricated, at least in part, by spin coating.

The J-V characteristics of the photovoltaic devices made using the spin coating method are depicted at FIG. 17. The device that included seven layers of PbS exhibited a PCE of 6.5%. A previously reported PCE was 6.0% for a device (FTO/TiO$_2$/PbS) that used an Au/Ag anode (Tang, J.; Kemp, K. W.; Hoogland, S.; Jeong, K. S.; Liu, H.; Levina, L.; Furukawa, M.; Wang, X.; Debnath, R.; Cha, D.; et al. Colloidal-quantum-dot photovoltaics using atomic-ligand passivation, *Nat. Mater.* 2011, 10, 765). Hence, a device of this example exhibited an improvement with the Cr/Ag electrode. The foregoing table also demonstrates that a spin-coated device of this example achieved a $V_{oc}$ of about 0.38 V, current density ($J_{sc}$) of about 35 mA/cm$^2$, and FF of about 0.5.

For both the spin-coated and the drop-cast devices of this example, low FF values were observed (e.g., less than 50%).

In this example, an $N_2$-filled glove box with controlled relative humidity was used during the fabrication of the device.

Figure 18:
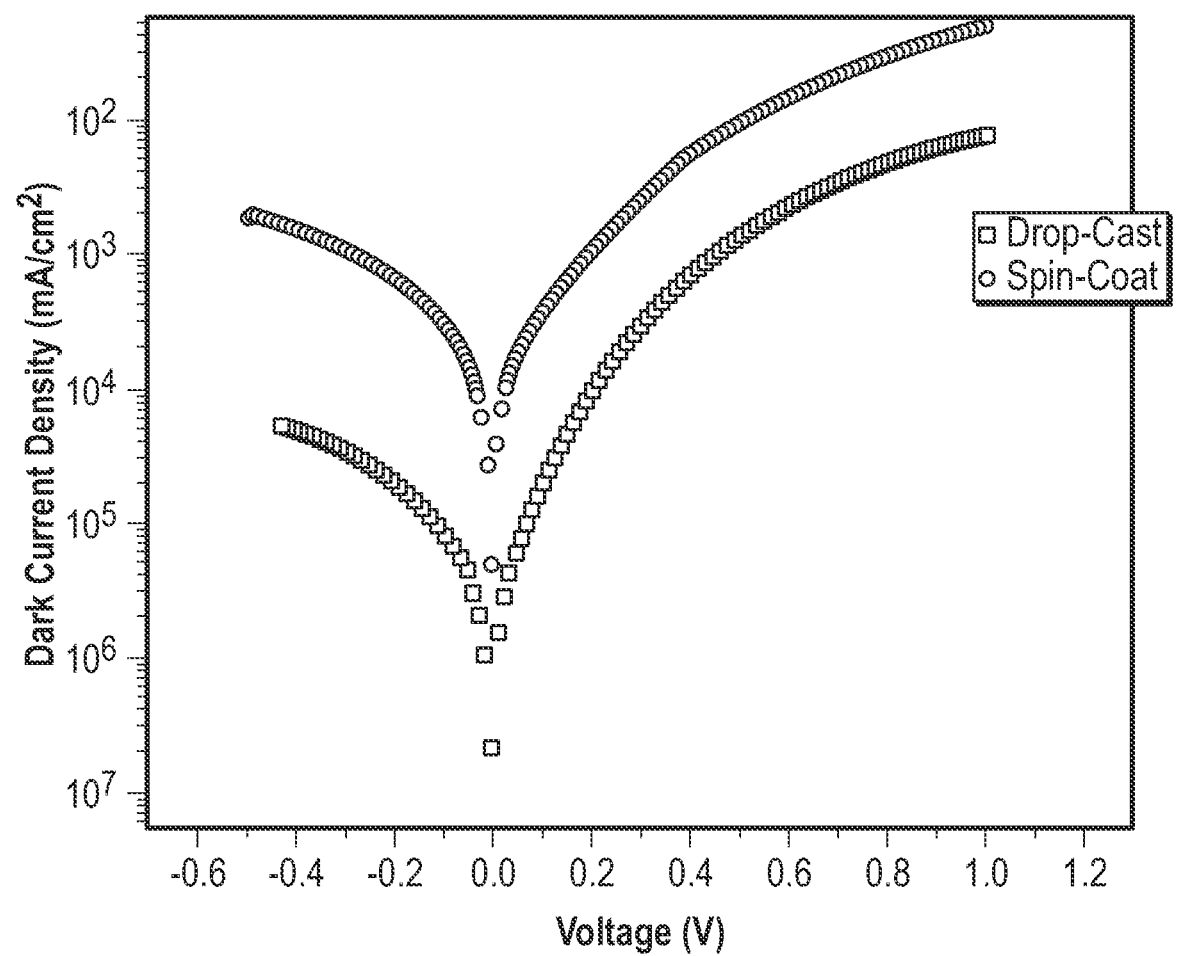
FIG. 18 depicts a dark J-V graph in log scale for embodiments (four-layered) of drop-cast and spin-coated devices.

The dark J-V graphs in log scale for both the drop-cast (four-layered) and spin-coated working devices of this example are depicted at FIG. 18. This figure shows that the leakage current was much lower for both the spin-coated and drop-cast devices of this example. In the forwarding direction, both devices showed a very small current density, which represented a higher rectification ratio. Therefore, both devices had excellent dark J-V characteristics.

A stability test was conducted on the spin-coated device. The device showed air exposure stability over five days without any encapsulation. The device was preserved in an $N_2$-filled glovebox, and during stability testing, the device was exposed to open air. On the first day, the PCE became high; however, on the remaining days, the PCE was stable.

Figure 19:
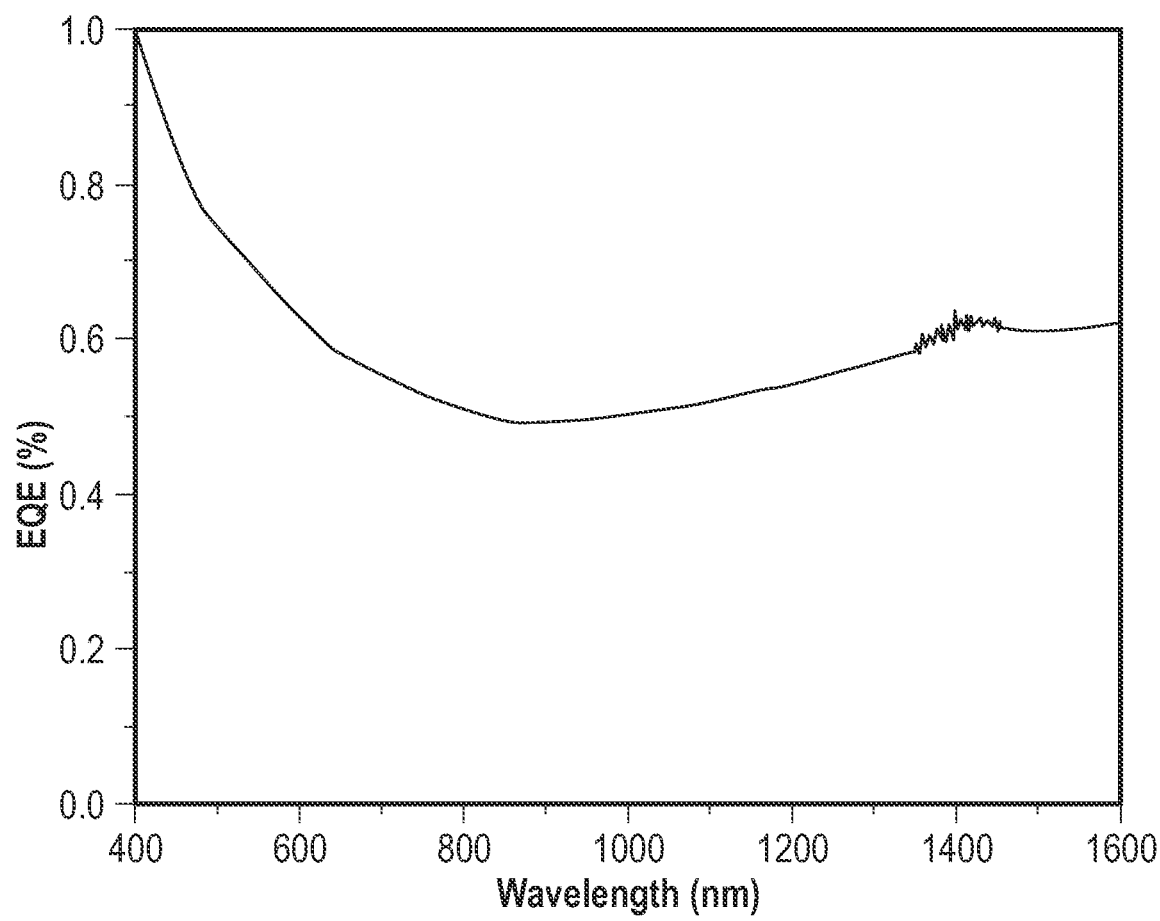
FIG. 19 depicts a plot of the external quantum efficiency (EQE) of an embodiment of a spin-coated device.

MATLAB™ simulation results on the external quantum efficiency (EQE) of the simulated device indicated that the device absorbed the light spectrum from 400 nm to 1600 nm. The EQE of the fabricated device also showed a similar outcome, as depicted at FIG. 19.

To investigate the necessity of LbL spin coating deposition, optical images were collected of the one- and five-layer spin-coated film surfaces. The one-layer spin-coated PbS surface showed many pinholes, whereas the five-layer spin coating showed no pinholes on the surface.

Also analyzed was the stability of back electrodes containing a Cr—Ag layer and those of only Ag during exposure to air. Optical images of the devices were collected after five days of air exposure. It was observed that the surface without Cr became cracked, whereas the Cr—Ag electrode was stable and uniform.

That which is claimed is:

1. A method of fabricating a photovoltaic cell, the method comprising:
   performing optical simulations and selecting, based on the optical simulations
   (i) a thickness of at least one of a first active layer, a second active layer, a third active layer, and optionally a fourth active layer, and
   (ii) one or more active materials of at least one of the first active layer, the second active layer, the third active layer, and optionally the fourth active layer;
   wherein the photovoltaic cell comprises
   a first electrode;
   a first layer stack;
   a second layer stack, wherein the first layer stack is arranged between the first electrode and the second layer stack;
   a second electrode, wherein the second layer stack is arranged between the first layer stack and the second electrode;
   a third layer stack arranged between the second layer stack and the second electrode; and
   optionally a fourth layer stack arranged between the third layer stack and the second electrode;
   wherein the first layer stack comprises a first hole transporting layer, the first active layer, and a first electron transporting layer, wherein the first active layer is arranged between the first hole transporting layer and the first electron transporting layer;
   wherein the second layer stack comprises a second hole transporting layer, the second active layer, and a second electron transporting layer, wherein the second active layer is arranged between the second hole transporting layer and the second electron transporting layer;
   wherein the third layer stack comprises a third hole transporting layer, the third active layer, and a third electron transporting layer, wherein the third active layer is arranged between the third hole transporting layer and the third electron transporting layer;
   wherein the fourth layer stack, when present, comprises a fourth hole transporting layer, the fourth active layer, and a fourth electron transporting layer, wherein the fourth active layer is arranged between the fourth hole transporting layer and the fourth electron transporting layer;
   wherein the first active layer, the second active layer, the third active layer, and the fourth active layer comprise one or more active materials that are independently selected from the group consisting of poly (3-hexylthiophene-2,5-diyl) (P3HT), indene-$C_{60}$ bisadduct (ICBA), poly ([2,6'-4,8-di (5-ethylhexylthienyl)benzo[1,2-b;3,3-b]dithiophene]{3-fluoro-2 [(2-ethylhexyl) carbonyl] thieno[3,4-b]thiophenediyl}) (PTB7-Th), [6,6]-phenyl-C71-butyric acid methyl ester (PCMB), poly[2,7-(5,5-bis-(3,7-dimethyloctyl)-5H-dithieno[3,2-b: 2',3'-d]pyran)-alt-4,7-(5,6-dirluoro-2,1,3-benzothia diazole) (PDTP-DFBT), poly[[2,5-bis(2-hexyldecyl-2,3,5,6-tetrahydro-3,6-dioxopyrrolo[3,4-c]pyrrole-1,4-diyl]-alt-[3',3"-dimethyl-2,2': 5',2"-terthiphene]-5,5"-diyl] (PMDPP3T), poly[2,1,3-benzothiadiazole-4,7-diyl[4,4-bis(2-ethylhexyl)-4H-silolo[3,2-b: 4,5-b'] dithiophene-2,6-diyl]] (Si-PCPDTBT), methylammonium lead iodide (MaPbI$_3$), and lead (II) sulfide (PbS); and
   wherein the first active layer, the second active layer, or the third active layer does not include MaPbI$_3$ or any other perovskite.

2. The method of claim 1, further comprising:
providing the first electrode and the second electrode; and arranging between the first electrode and the second electrode the first layer stack, the second layer stack, the third layer stack, and optionally the fourth layer stack.

3. The method of claim 1, wherein the first active layer, the second active layer, or the first active layer and the second active layer comprises lead (II) sulfide (PbS).

4. The method of claim 1, wherein the first active layer, the second active layer, or the first active layer and the second active layer comprise poly(3-hexylthiophene-2,5-diyl) (P3HT), indene-$C_{60}$ bisadduct (ICBA), methylammonium lead iodide (MaPbI$_3$), lead (II) sulfide (PbS), or a combination thereof.

5. The method of claim 1, wherein the thickness of the first active layer is about 300 nm to about 1,500 nm.

6. The method of claim 1, wherein the thickness of the first active layer is about 380 nm to about 500 nm.

7. The method of claim 1, wherein the thickness of the second active layer is about 300 nm to about 1,500 nm.

8. The method of claim 1, wherein the thickness of the second active layer is about 380 nm to about 500 nm.

9. The method of claim 1, wherein the first electron transporting layer, the second electron transporting layer, or the first electron transporting layer and the second electron transporting layer comprise a metal oxide.

10. The method of claim 9, wherein the metal oxide is selected from the group consisting of $SnO_2$, $TiO_2$, and ZnO.

11. The method of claim 1, wherein the first electron transporting layer, the second electron transporting layer, or the first electron transporting layer and the second electron transporting layer comprise [6,6]-phenyl-$C_{61}$-butyric acid methyl ester (PCBM).

12. The method of claim 1, wherein the first hole transporting layer, the second hole transporting layer, or the first hole transporting layer and the second hole transporting layer comprises nickel oxide (NiO), $N^2,N^2,N^{2'},N^{2'},N^7,N^7,N^{7'},N^{7'}$-octakis (4-methoxyphenyl)-9,9'-spirobi[9H-fluorene]-2,2',7,7'-tetramine (Spiro-OMeTAD), polytriarylamine (PTAA), fluorine-dithiophene (FDT), Cu-phthalocyanine (CuPc), copper (I) thiocyanate (CuSCN), poly 3-hexylthiophene (P3HT), poly(3,4-ethylenedioxythiophene) polystyrene sulfonate (PEDOT:PSS), poly[[(2,4-dimethylphenyl)imino]-1,4-phenylene (9,9-dioctyl-9H-fluorene-2,7-diyl)-1,4-phenylene] (PF8-TAA), poly (9,9-dioctylfluorene) (PFO), polyaniline (PANI), poly[N-9'-heptadecanyl-2,7-carbazole-alt-5,5-(4',7'-di-2-thienyl-T,1', 3'-benzothiadiazole) (PCPDTBT), N-(6-amino-2,4-dioxo-1-propylpyrimidin-5-yl)-N-(2-methoxyethyl)-2-phenylbutanamide (PDPP3T), or a combination thereof.

13. The method of claim 1, wherein the photovoltaic device comprises the fourth layer stack arranged between the third layer stack and the second electrode.

14. The method of claim 13, wherein the first active layer, the second active layer, the third active layer, the fourth active layer, or any combination thereof comprises lead (II) sulfide (PbS).

15. The method of claim 13, wherein the first active layer, the second active layer, the third active layer, the fourth active layer, or any combination thereof comprises poly(3-hexylthiophene-2,5-diyl) (P3HT), indene-$C_{60}$ bisadduct (ICBA), methylammonium lead iodide (MaPbI$_3$), lead (II) sulfide (PbS), or a combination thereof.

16. The method of claim 13, wherein the thickness of the first active layer, the second active layer, the third active layer, and the fourth active layer, independently, is about 300 nm to about 1,500 nm.

17. The method of claim 13, wherein the thickness of the first active layer, the second active layer, the third active layer, and the fourth active layer, independently, is about 380 nm to about 500 nm.

* * * * *